US009741908B2

(12) United States Patent
Yoshimura et al.

(10) Patent No.: US 9,741,908 B2
(45) Date of Patent: Aug. 22, 2017

(54) WAVELENGTH CONVERTING MEMBER, LIGHT-EMITTING DEVICE, AND METHOD FOR PRODUCING WAVELENGTH CONVERTING MEMBER

(71) Applicants: Sharp Kabushiki Kaisha, Osaka-shi, Osaka (JP); National Institute for Materials Science, Tsukuba-shi, Ibaraki (JP)

(72) Inventors: Kenichi Yoshimura, Osaka (JP); Makoto Izumi, Osaka (JP); Masamichi Harada, Tsukuba (JP); Hiroshi Fukunaga, Osaka (JP); Kazunori Annen, Osaka (JP); Naoto Hirosaki, Tsukuba (JP); Hiroyo Segawa, Tsukuba (JP)

(73) Assignees: SHARP KABUSHIKI KAISHA, Sakai (JP); NATIONAL INSTITUTE FOR MATERIALS SCIENCE, Ibaraki (JP)

(*) Notice: Subject to any disclaimer, the term of this patent is extended or adjusted under 35 U.S.C. 154(b) by 0 days.

(21) Appl. No.: 15/005,274

(22) Filed: Jan. 25, 2016

(65) Prior Publication Data
US 2016/0225963 A1 Aug. 4, 2016

(30) Foreign Application Priority Data

Jan. 30, 2015 (JP) ................. 2015-017832

(51) Int. Cl.
*H01L 33/00* (2010.01)
*H01L 33/50* (2010.01)
(Continued)

(52) U.S. Cl.
CPC ............ *H01L 33/504* (2013.01); *C03B 19/12* (2013.01); *C03C 14/006* (2013.01); *C09K 11/7734* (2013.01); *C03C 2214/16* (2013.01)

(58) Field of Classification Search
CPC ..................................... H01L 33/504
See application file for complete search history.

(56) References Cited

U.S. PATENT DOCUMENTS 8,901,593 B2 * 12/2014 Fujino ............. H01L 33/50
252/301.4 P
2002/0070449 A1 6/2002 Yagi et al.
(Continued)

FOREIGN PATENT DOCUMENTS

JP 10-163535 A 6/1998
JP 2002-203989 A 7/2002
(Continued)

OTHER PUBLICATIONS

Kitabatake et al., "Optical and adhesive properties of composite silica-impregnated Ca-α-SiAlON:Eu2+ phosphor films prepared on silica glass substrates", Journal of the European Ceramic Society 32, 2012, pp. 1365-1369.
(Continued)

*Primary Examiner* — Jamie C Niesz
(74) *Attorney, Agent, or Firm* — Keating & Bennett, LLP

(57) ABSTRACT

A wavelength converting member includes silica glass and a plurality of fluorescent material particles including an oxynitride or nitride fluorescent material and dispersed in the silica glass. The plurality of fluorescent material particles include at least two kinds of fluorescent material particles including (i) first fluorescent material particles that emit a fluorescence having a first peak wavelength and (ii) second fluorescent material particles that emit a fluorescence having a second peak wavelength. The wavelength converting member has a density within a range from 0.8 g/cm³ to 1.2 g/cm³.

12 Claims, 11 Drawing Sheets

(51) Int. Cl.
  *C03B 19/12* (2006.01)
  *C09K 11/77* (2006.01)
  *C03C 14/00* (2006.01)

(56) References Cited

U.S. PATENT DOCUMENTS

| | | | |
|---|---|---|---|
| 2011/0133237 A1* | 6/2011 | Koike | H01L 33/501 257/98 |
| 2012/0140496 A1* | 6/2012 | Kishimoto | B82Y 20/00 362/459 |
| 2012/0223272 A1* | 9/2012 | Majima | B32B 33/00 252/299.7 |
| 2015/0211712 A1* | 7/2015 | Yoshimura | F21V 9/16 362/84 |

FOREIGN PATENT DOCUMENTS

| | | |
|---|---|---|
| JP | 2007-191702 A | 8/2007 |
| JP | 2011-168627 A | 9/2011 |
| JP | 2015-142046 A | 8/2015 |

OTHER PUBLICATIONS

Segawa et al., "Fabrication of silica glass containing yellow oxynitride phosphor by the sol-gel process", Science and Technology of Advanced Materials 12, 2011, pp. 1-5.

Zalite et al, "α-sialon ceramics fabricated from nanopowders by sintering and hot pressing", Proc. Estonian Acad. Sci. Eng., 2006, pp. 455-463.

Denki Kagaku Kogyo Kabushiki Kaisha, "Material Safety Data Sheet", Version 7, Serial No. 052-P027E, Revised on Dec. 1, 2013, pp. 1-8.

* cited by examiner

FIG. 10

| WAVELENGTH CONVERTING MEMBER | FIRING TEMPERATURE FOR SILICA GLASS | FLUORESCENT MATERIAL PARTICLES | | DENSITY d (g/cm$^3$) OF WAVELENGTH CONVERTING MEMBER | CONTENT RATE v (% BY VOLUME) OF FLUORESCENT MATERIAL PARTICLES |
|---|---|---|---|---|---|
| EXAMPLE 1 | 600°C | PRODUCTION EXAMPLE 1 | β-SiAlON | 0.91 | 1.47 |
| EXAMPLE 2 | 400°C | PRODUCTION EXAMPLE 2 | CaAlSiN$_3$ | 0.89 | 1.36 |
| EXAMPLE 3 | 600°C | PRODUCTION EXAMPLE 1 | β-SiAlON | 0.92 | 2.11 |
|  |  | PRODUCTION EXAMPLE 3 | α-SiAlON |  |  |
| EXAMPLE 4 | 400°C | PRODUCTION EXAMPLE 1 | β-SiAlON | 0.90 | 2.01 |
|  |  | PRODUCTION EXAMPLE 2 | CaAlSiN$_3$ |  |  |
| COMPARATIVE EXAMPLE 1 | 1050°C | PRODUCTION EXAMPLE 1 | β-SiAlON | 2.10 | 3.33 |
| COMPARATIVE EXAMPLE 2 | 1050°C | PRODUCTION EXAMPLE 2 | CaAlSiN$_3$ | 2.15 | 3.24 |
| COMPARATIVE EXAMPLE 3 | — | PRODUCTION EXAMPLE 1 | β-SiAlON | 2.35 | 65.00 |
|  |  | PRODUCTION EXAMPLE 3 | α-SiAlON |  |  |

FIG. 11

| LIGHT-EMITTING DEVICE | WAVELENGTH CONVERTING MEMBER | COLOR TEMPERATURE (K) | COLOR RENDERING INDEX Ra | CHROMATICITY POINT ($CIE_x$, $CIE_y$) | LUMINOUS FLUX (lm) |
|---|---|---|---|---|---|
| EXAMPLE 5 | EXAMPLE 3 | 3,580 | 63 | (0.395, 0.371) | 7.2 |
| EXAMPLE 6 | EXAMPLE 4 | 5,000 | 78 | (0.334, 0.330) | 5.9 |
| COMPARATIVE EXAMPLE 4 | COMPARATIVE EXAMPLE 3 | 3,546 | 60 | (0.399, 0.379) | 5.7 |

US 9,741,908 B2

WAVELENGTH CONVERTING MEMBER, LIGHT-EMITTING DEVICE, AND METHOD FOR PRODUCING WAVELENGTH CONVERTING MEMBER

This Nonprovisional application claims priority under 35 U.S.C. §119 on Patent Application No. 2015-017832 filed in Japan on Jan. 30, 2015, the entire contents of which are hereby incorporated by reference.

TECHNICAL FIELD

The present invention relates to (i) a wavelength converting member containing a fluorescent material that converts excitation light into fluorescence, (ii) a light-emitting device including the wavelength converting member, and (iii) a method for producing the wavelength converting member.

BACKGROUND ART

Recent years have seen development of a light-emitting device that combines (i) a semiconductor light-emitting element such as a light-emitting diode (LED) with (ii) a wavelength converting member that converts excitation light from the semiconductor light-emitting element into fluorescence (for example, a member containing fluorescent material particles dispersed in resin). The above light-emitting device, which is advantageously compact and consumes less power than an incandescent lamp, is in practical use as a light source for any of various display devices and illumination devices.

Patent Literature 1 discloses a light-emitting device that outputs pseudo-white light. This light-emitting device combines a blue LED with a fluorescent material (wavelength converting member) that is excited by blue light from the blue LED and that converts the wavelength of the blue light to emit yellow light.

Recently, studies have been conducted of using, for example, a semiconductor laser, which has a light density higher than that of a blue LED or the like, as an excitation-light source for the above light-emitting device. Further, studies have also been conducted of using, as excitation light, light having a wavelength shorter than that of blue light.

Such arrangements are, however, problematic in that resin in which fluorescent material particles are dispersed is degraded by heat or light. To solve this problem, techniques have been proposed of using glass as a material in which to disperse fluorescent material particles.

Patent Literature 2, for example, discloses a wavelength converting member including fluorescent material particles (which are made of a material such as an oxide, a sulfide, an oxysulfide, a halide, or an aluminate) dispersed in glass. Patent Literature 2 mentions $ZnO$—$B_2O_3$—$SiO_2$-based glass as a material suitable for the glass.

In Patent Literature 2, the glass material has a composition selected so that the glass can be fired at a temperature within a range of relatively low temperatures. Specifically, the glass material has a composition selected so that the firing temperature for glass is 750° C. or lower. This selection intends to prevent fluorescent material particles dispersed in glass from being degraded by heat when the glass is fired.

The glass material used in Patent Literature 2 is, however, problematically low in transparency and unstable thermally and chemically as compared to silica glass (which is a glass that does not contain any metallic element other than Si [such as Zn and Ba] and that is made of $SiO_2$ only).

Regarding the above point, Non Patent Literature 1 discloses an arrangement in which fluorescent material particles made of an oxynitride fluorescent material are dispersed in silica glass. In Non Patent Literature 1, the silica glass is prepared through a sol-gel process.

In Non Patent Literature 1, the fluorescent material particles are made of an oxynitride fluorescent material, which is excellent in thermal and chemical stability. This allows silica glass in which the fluorescent material particles are dispersed to be fired at a high firing temperature of 1050° C.

Silica glass is, as described above, high in transparency and excellent in thermal and chemical stability. Non Patent Literature 1 thus allows production of a wavelength converting member that is high in luminous efficiency and excellent in durability.

Note that in Non Patent Literature 1, the firing temperature for silica glass is a high temperature of 1000° C. or higher. This makes it necessary to select, as the fluorescent material particles to be dispersed in silica glass, fluorescent material particles that are not degraded thermally in the atmosphere even at a temperature of 1000° C. or higher.

Among various fluorescent material materials in practical use, however, the α-SiAlON fluorescent material, disclosed in Non Patent Literature 1, is the only material that satisfies the above condition. Stated differently, the technique disclosed in Non Patent Literature 1 unfortunately allows only one color for a fluorescence emitted by fluorescent material particles (that is, α-SiAlON fluorescent material particles) dispersed in silica glass.

This means that the technique disclosed in Non Patent Literature 1 fails to make it possible to (i) disperse in silica glass a plurality of kinds of fluorescent material particles which kinds emit respective fluorescences having different colors and (ii) mix such fluorescences emitted by the respective kinds of fluorescent material particles and having different colors. The technique disclosed in Non Patent Literature 1 thus problematically has a low degree of freedom in designing the color of light emitted by a wavelength converting member.

The wavelength converting member of Non Patent Literature 1 has a low degree of freedom in designing the color of light emitted by the wavelength converting member. Thus, in a case where the wavelength converting member is combined with an excitation-light source to produce a light-emitting device, the light-emitting device problematically has a degraded color rendering property. Further, in a case where the light-emitting device is included in a display device, the display device problematically has decreased color reproducibility.

Non Patent Literature 2 and Patent Literature 3 each disclose an arrangement in which (i) a film of an oxynitride fluorescent material is formed on a substrate to form a fluorescent material film and (ii) the fluorescent material film is then bonded to the substrate with use of silica glass.

In Non Patent Literature 2 and Patent Literature 3, the firing temperature for silica glass is approximately 500° C., which is lower than the firing temperature of Non Patent Literature 1. The respective techniques of Non Patent Literature 2 and Patent Literature 3 thus each allow a wide range of options, as compared to the technique of Non Patent Literature 1, for the material of fluorescent material particles to be excited by blue light serving as excitation light.

Specifically, the respective techniques of Non Patent Literature 2 and Patent Literature 3 may each use, as a material of the fluorescent material particles, (i) an oxynitride fluorescent material such as a β-SiAlON fluorescent material or (ii) a nitride fluorescent material such as a $CaSiAlN_3$ fluorescent material (CASN-based fluorescent material).

According to the respective techniques of Non Patent Literature 2 and Patent Literature 3, however, the wavelength converting member (light-emitting section) is limited in shape to a film. This limitation leads to a low degree of freedom in the shape of the wavelength converting member and also to an excessive amount of fluorescent material particles to be contained in the wavelength converting member. The fluorescent material particles may, for example, be contained in the wavelength converting member in an amount as large as 30% or greater by volume.

In a case where a wavelength converting member containing fluorescent material particles excessively as described above is included in a light-emitting device, those fluorescent material particles cause light to be scattered excessively in the wavelength converting member, with the problematic result of decreased efficiency of extraction of light from the wavelength converting member (stated differently, decreased efficiency of excitation light conversion by the wavelength converting member).

In the case where the efficiency of extraction of light from the wavelength converting member is decreased, a light-emitting device that combines the wavelength converting member with an excitation-light source problematically has decreased luminous efficiency.

Patent Literature 4 discloses firing silica glass at a low firing temperature through a sol-gel process. Specifically, in Patent Literature 4, sulfide fluorescent material particles are dispersed in silica glass, and this silica glass is fired at a firing temperature of 150° C.

CITATION LIST

Patent Literature 1

Japanese Patent Application Publication, Tokukaihei, No. 10-163535 A (Publication Date: Jun. 19, 1998)

Patent Literature 2

Japanese Patent Application Publication, Tokukai, No. 2007-191702 A (Publication Date: Aug. 2, 2007)

Patent Literature 3

Japanese Patent Application Publication, Tokukai, No. 2011-168627 A (Publication Date: Sep. 1, 2011)

Patent Literature 4

Japanese Patent Application Publication, Tokukai, No. 2002-203989 A (Publication Date: Jul. 19, 2002)

Non Patent Literature 1

"Fabrication of silica glass containing yellow oxynitride phosphor by the sol-gel process", SCIENCE AND TECHNOLOGY OF ADVANCED MATERIALS 12 (2011) 034407 (5 pp)

Non Patent Literature 2

"Optical and adhesive properties of composite silica-impregnated Ca-α-SiAlON: $Eu^{2+}$ phosphor films prepared on silica glass substrates", Journal of the European Ceramic Society 32 (2012) 1365-1369

SUMMARY OF INVENTION

Technical Problem

None of the conventional art documents listed above discloses or suggests that for a wavelength converting member including silica glass and nitride or oxynitride fluorescent material particles dispersed in the silica glass, it is possible to both (i) increase the degree of freedom in designing the color of light emitted by the wavelength converting member and (ii) efficiently extract light from the wavelength converting member. Therefore, none of the conventional art documents makes it possible to produce a wavelength converting member having an increased degree of freedom in designing the color of light emitted and sufficiently improved efficiency of excitation light conversion.

The present invention has been accomplished to solve the above problem. It is an object of the present invention to provide a wavelength converting member having (i) an increased degree of freedom in designing the color of light emitted and (ii) efficiency of excitation light conversion which efficiency is improved over conventional art.

Solution to Problem

In order to solve the above problem, a wavelength converting member according to an aspect of the present invention is a wavelength converting member including: silica glass; and a plurality of fluorescent material particles including an oxynitride fluorescent material or nitride fluorescent material and dispersed in the silica glass, the plurality of fluorescent material particles including at least two kinds of fluorescent material particles, the at least two kinds of fluorescent material particles including: a first fluorescent material particle that, upon receipt of excitation light, emits a fluorescence having a first peak wavelength; and a second fluorescent material particle that, upon receipt of the excitation light, emits a fluorescence having a second peak wavelength, which is different from the first peak wavelength, the wavelength converting member having a density within a range from 0.8 $g/cm^3$ to 1.2 $g/cm^3$.

In order to solve the above problem, a method according to an aspect of the present invention for producing a wavelength converting member is a method for producing a wavelength converting member including silica glass and a plurality of fluorescent material particles including an oxynitride fluorescent material or nitride fluorescent material and dispersed in the silica glass, the method including the step of dispersing in the silica glass at least two kinds of fluorescent material particles, the at least two kinds of fluorescent material particles including: a first fluorescent material particle that, upon receipt of excitation light, emits a fluorescence having a first peak wavelength; and a second fluorescent material particle that, upon receipt of the excitation light, emits a fluorescence having a second peak wavelength, which is different from the first peak wavelength, the wavelength converting member being so produced as to have a density within a range from 0.8 $g/cm^3$ to 1.2 $g/cm^3$.

Advantageous Effects of Invention

A wavelength converting member according to an aspect of the present invention advantageously both increases the degree of freedom in designing the color of light emitted and improves the efficiency of excitation light conversion over conventional art.

A method according to an aspect of the present invention for producing a wavelength converting member advantageously allows production of a wavelength converting member having both an increased degree of freedom in designing the color of light emitted and efficiency of excitation light conversion which efficiency is improved over conventional art.

BRIEF DESCRIPTION OF DRAWINGS

FIG. 10 is a table that shows data of the results of evaluation of respective wavelength converting members of Examples and Comparative Examples of the present invention.

FIG. 11 is a table that shows data of the results of evaluation of respective light-emitting devices of Examples and Comparative Examples of the present invention.

DESCRIPTION OF EMBODIMENTS

Embodiment 1

Embodiment 1 of the present invention is described below with reference to FIGS. 1 through 5 and 10.

(Configuration of Wavelength Converting Member 1)

Figure 1:
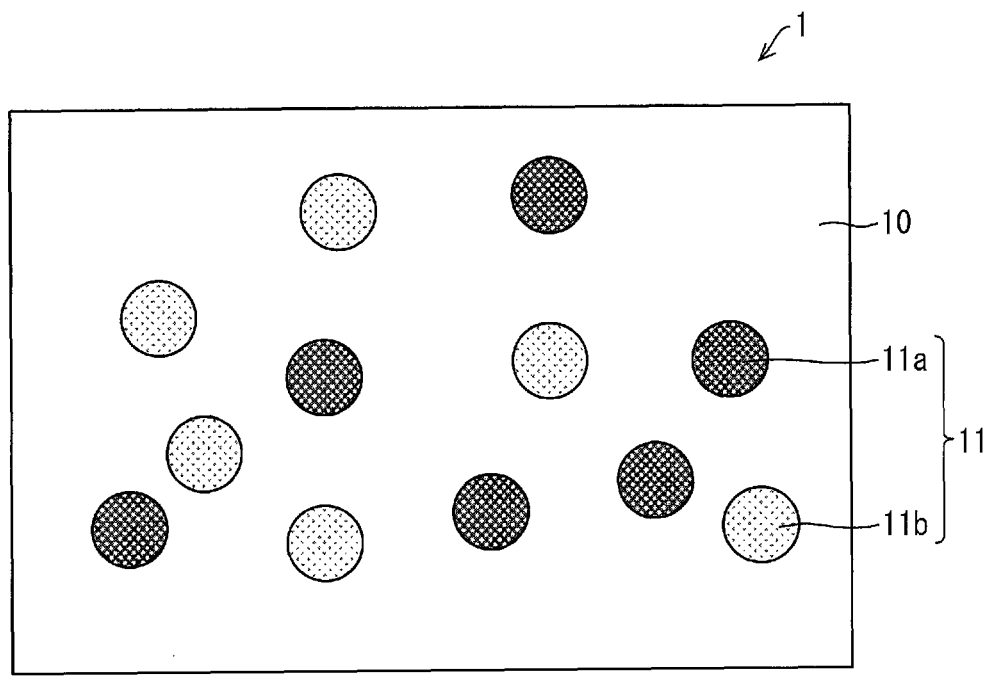
FIG. 1 is a diagram schematically illustrating a configuration of a wavelength converting member of Embodiment 1 of the present invention.

FIG. 1 is a diagram schematically illustrating a structure of a wavelength converting member 1. The wavelength converting member 1 includes silica glass 10 and fluorescent material particles 11. The wavelength converting member 1 is prepared by, as described below, substantially uniformly dispersing in the silica glass 10 a plurality of fluorescent material particles 11 containing a nitride fluorescent material or oxynitride fluorescent material.

The fluorescent material particles 11 preferably include a plurality of kinds (at least two kinds) of fluorescent material particles for an increased degree of freedom in designing the color of light emitted from the wavelength converting member 1. The fluorescent material particles 11 may include, for example, two kinds of fluorescent material particles, namely first fluorescent material particles 11a and second fluorescent material particles 11b, as illustrated in FIG. 1.

The first fluorescent material particles 11a emit a fluorescence having a first peak wavelength. The second fluorescent material particles 11b emit a fluorescence having a second peak wavelength, which differs from the first peak wavelength. Stated differently, the first fluorescent material particles 11a and the second fluorescent material particles 11b emit respective fluorescences having different colors.

The first fluorescent material particles 11a may be, as an example, β-SiAlON fluorescent material particles that have a peak wavelength (first peak wavelength) of approximately 540 nm and that emit a green fluorescence. The second fluorescent material particles 11b may be, as an example, α-SiAlON fluorescent material particles that have a peak wavelength (second peak wavelength) of approximately 597 nm and that emit an orange fluorescence. The second fluorescent material particles 11b may alternatively be CASN-based fluorescent material particles that have a peak wavelength (second peak wavelength) of approximately 650 nm and that emit a red fluorescence.

Further, the present embodiment is arranged such that the wavelength converting member 1 is so prepared as to have a density d (g/cm$^3$) that satisfies Formula (1) below. The density d in Formula (1) has a numerical range, the grounds for which will be discussed later in detail.

$$0.8 \le d \le 1.2 \tag{1}$$

The present embodiment is further arranged such that the wavelength converting member 1 is so prepared as to contain fluorescent material particles 11 at a content rate v (% by volume) that satisfies Formula (2) below. The content rate v in Formula (2) has a numerical range, the grounds for which will also be discussed later in detail.

$$0.1 \le v \le 10 \tag{2}$$

More specifically, during the preparation of the wavelength converting member 1, (i) the density of the silica glass 10 is controlled so that the density is at least close to 1 g/cm$^3$, which is approximately half the true density of 2.2 g/cm$^3$, and (ii) the wavelength converting member 1 contains fluorescent material particles 11 in an appropriately controlled amount (content). Such preparation allows the wavelength converting member 1 to (i) have the density d in Formula (1) and to (ii) contain fluorescent material particles 11 at the content rate v in Formula (2).

The density d in Formula (1) may be calculated by measuring the volume V (cm$^3$) and weight W (g) of the wavelength converting member 1 and solving d=W/V. The volume V may be (i) calculated on the basis of the result of measuring the dimensions of the wavelength converting member 1 with use of a micrometer or the like or (ii) measured by an Archimedean method. The weight W may be measured with use of an electronic scale or the like.

(Method for Producing Wavelength Converting Member 1)

Figure 2:
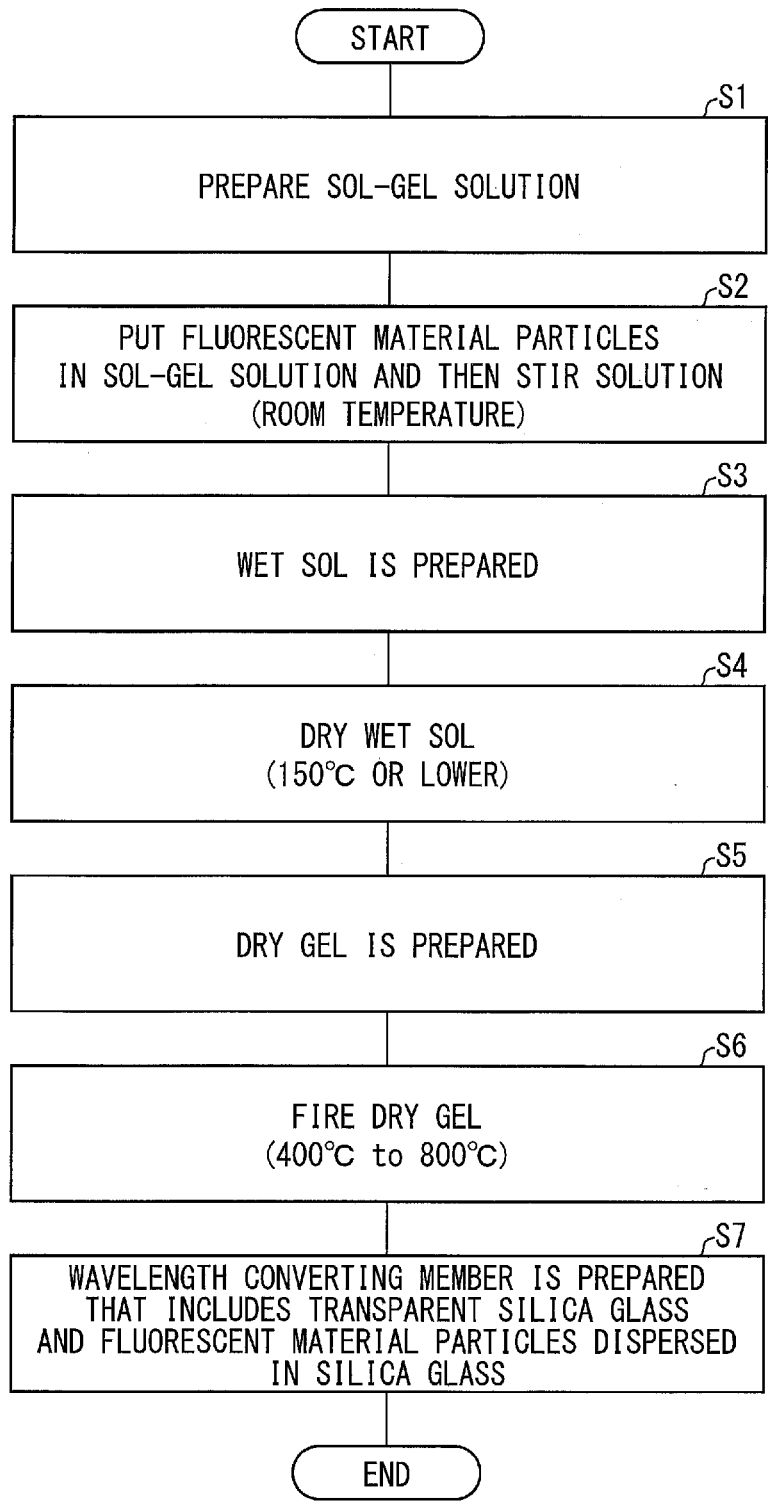
FIG. 2 is a flowchart of individual steps for preparing a wavelength converting member of Embodiment 1 of the present invention through a sol-gel process.

The wavelength converting member 1 of the present embodiment may be prepared through a sol-gel process. FIG. 2 is a flowchart of individual steps S1 to S7 for preparing a wavelength converting member 1 through a sol-gel process. The description below deals with the individual steps of the sol-gel process with reference to FIG. 2.

In the sol-gel process, a sol-gel solution containing a starting material for the silica glass 10 is prepared first. The sol-gel solution contains (i) a compound serving as a raw material for glass, and (ii) water, a solvent, and a catalyst that are necessary for hydrolysis. The sol-gel solution may as necessary further contain, for example, a compound acting as a drying control agent.

The compound serving as a raw material for glass may be a silicon alkoxide such as tetraethoxysilane (tetraethyl orthosilicate [TEOS]) or tetramethoxysilane (tetramethyl orthosilicate [TMOS]).

The solvent may be an alcohol such as ethanol or methanol. The catalyst may be (i) an acidic aqueous solution such as hydrochloric acid or (ii) a basic aqueous solution such as ammonium hydroxide.

The compound acting as a drying control agent may be a compound having a high boiling point and small surface tension. The compound may suitably be, for example, N,N-dimethylformamide (DMF) or formamide.

For the present embodiment, a sol-gel solution is prepared by mixing, for example, TMOS, DMF, methanol, pure water, and ammonium hydroxide with one another (step S1). Next, a predetermined amount of fluorescent material particle powder is put into the sol-gel solution prepared. The resulting solution is then stirred at room temperature over a predetermined time period (step S2).

The above operation allows the TMOS to be hydrolyzed by catalysis of ammonium ions contained in the ammonium hydroxide, thus producing silanol. Then, condensation polymerization causes siloxane bonds to be formed.

The formation of siloxane bonds produces a wet sol having a viscosity higher than that of the sol-gel solution (step S3). The step S3 allows a wet sol to be produced that has a viscosity high enough for the fluorescent material particles not to precipitate when the wet sol is left to stand at room temperature.

Next, the wet sol produced through the step S3 is dried in an oven at a temperature of 150° C. or lower (step S4; drying step). This drying produces a dry gel containing substantially uniformly dispersed fluorescent material particles (step S5).

The step S4 (drying step) causes the wet gel to be dried slowly over a time period of 100 hours or longer. This allows a dry gel to be produced in the step S5 which dry gel has only a small number of cracks.

Next, the dry gel produced through the step S5 is taken out of the oven, placed in a baking furnace, and fired at a temperature within a range from 400° C. to 800° C. (step S6; firing step). The step S6 (firing step) allows a wavelength converting member 1 to be produced that includes transparent silica glass 10 and fluorescent material particles 11 dispersed in the silica glass 10 (step S7).

During the step S5 (that is, at a stage preceding the step S6 [firing step]), the wavelength converting member is whitishly cloudy as is observed even visually. Stated differently, during the step S5, the wavelength converting member has a silica glass portion at which a large amount of light is scattered.

In view of that, the step S6 (firing step) causes the dry gel to be fired at a temperature within a range from 400° C. to 800° C. This firing allows the silica glass portion to have a sufficient light-transmission property (transparency).

The expression "sufficient light-transmission property" as used for the present embodiment refers to the state in which in the light wavelength range from 350 nm to 800 nm, a glass sample having a thickness of 1 mm or larger and containing no fluorescent material dispersed has a light transmittance of 90% or greater which light transmittance assumes light reflected at a surface of the silica glass to be light not passing through the silica glass.

During the step S5, which involves a low drying temperature of 150° C. or lower, the wavelength converting member still contains an organic component derived from an organic side chain such as a methoxy group. During the subsequent step S6, the dry gel is fired at a temperature within a range from 400° C. to 800° C. This firing decomposes or volatilizes all of the organic component.

A later description will deal in detail with how it is a disadvantage for a wavelength converting member to contain a remaining organic component.

(Properties of Silica Glass 10)

As illustrated in FIG. 2, the silica glass 10 included in the wavelength converting member 1 is produced through a sol-gel process in which silica glass is fired at a temperature within a range from 400° C. to 800° C.

Non Patent Literature 1 mentioned above, in contrast, discloses a technique of preparing a wavelength converting member through a sol-gel process in which silica glass is fired at a high temperature of 1000° C. or higher. Specifically, according to Non Patent Literature 1, silica glass is fired at a temperature of 1050° C. to have an increased density (for example, a density of 2.0 g/cm$^3$ or larger) close to the true density.

As described above, the silica glass 10 of the present embodiment is fired at a temperature (within a range from 400° C. to 800° C.) sufficiently lower than the temperature (1050° C.) at which silica glass is fired according to Non Patent Literature 1.

The silica glass 10 of the present embodiment thus allows an increased degree of freedom, as compared to the silica glass of Non Patent Literature 1, in selecting a material for fluorescent material particles dispersible in the silica glass 10.

The wavelength converting member 1 of the present embodiment may be prepared through a sol-gel process similarly to Non Patent Literature 1. The wavelength converting member 1 of the present embodiment is thus also advantageous in that the wavelength converting member 1 is easy to prepare similarly to conventional wavelength converting members.

Further, as described above, the silica glass 10 has a density approximately half the true density. This means that the silica glass 10 has a density sufficiently lower than the density (that is, a density of 2.0 g/cm$^3$ or larger) of the silica glass of Non Patent Literature 1. The silica glass 10, therefore, has the following two advantages over the silica glass of Non Patent Literature 1:

(Advantage 1): The silica glass 10 has a refractive index lower than the refractive index of the silica glass of Non Patent Literature 1.

The silica glass 10 thus has reduced total reflection at the interface between air and the glass as compared to the silica glass of Non Patent Literature 1. This allows the wavelength converting member 1 to have an efficiency of excitation light conversion improved over that of the wavelength converting member of Non Patent Literature 1.

(Advantage 2): The silica glass 10 has a thermal conductivity lower than the thermal conductivity of the silica glass of Non Patent Literature 1.

A light-emitting device 100 described later and illustrated in FIG. 3 (that is, a light-emitting device that combines the wavelength converting member 1 with a semiconductor light-emitting element 23) is thus subjected to reduced influence of a temperature change caused by a change in an external environment. This configuration makes it possible to prevent degradation of, for example, the semiconductor light-emitting element 23 in the light-emitting device 100 or a package material.

The silica glass 10 and the fluorescent material particles 11 are each made of a thermally and chemically stable material. This means that the wavelength converting member 1 of the present embodiment has high stability against a temperature change. The light-emitting device 100, including the wavelength converting member 1, is thus particularly suitable as a light-emitting device (for example, a light-emitting device for a refrigerator or medical device) for use in an environment that is harsh in terms of temperature.

Patent Literature 4 discloses firing silica glass at a low firing temperature of 150° C. as mentioned above. According to Patent Literature 4, the fluorescent material particles are made of a sulfide fluorescent material, which is less stable thermally and chemically. This seems to be the reason why silica glass is fired at such an extremely low firing temperature.

The silica glass of Patent Literature 4 is, however, not suitable as a material for a wavelength converting member for the following two reasons:

(Reason 1): A low firing temperature of 150° C. does not allow silica glass to contract sufficiently, leaving a large number of holes in the silica glass. These holes cause light to be scattered in the silica glass, with the result of the silica glass having a degraded light-transmission property. In the case where silica glass is fired at a temperature of 150° C., the silica glass has a light-transmission property so degraded that the silica glass is whitishly cloudy as is observed even visually.

A wavelength converting member including silica glass with such low transparency will have decreased efficiency of excitation light conversion. Further, a light-emitting device including such a wavelength converting member will have decreased luminous efficiency.

(Reason 2): In a sol-gel process, silica glass is prepared from, as a starting material, a solution of a compound containing a carbon atom in a side chain. An excessively low firing temperature causes the carbon component to remain in the silica glass. In a case where a carbon component remains in silica glass, the silica glass has decreased thermal and chemical stability, with the result of decreased reliability for a wavelength converting member to be produced.

Further, in the case where a carbon component remains in silica glass, irradiating the wavelength converting member with excitation light having high intensity may (i) cause the carbon component to be separated out and thus (ii) blacken the silica glass. This blackening in turn causes the silica glass to have a degraded light-transmission property, with the result of the wavelength converting member having decreased efficiency of excitation light conversion.

For the two reasons discussed above, the silica glass of Patent Literature 4, which is fired at a low firing temperature of 150° C., is not suitable as a material for a wavelength converting member.

In contrast, the silica glass 10 of the present embodiment is fired at a temperature of 800° C. or lower. Although it has a density lower than the true density, the silica glass 10 has a light-transmission property sufficient for practical use. The silica glass 10, in other words, has a sufficient light-transmission property as compared to the silica glass of Patent Literature 4.

The wavelength converting member 1 of the present embodiment thus has efficiency of excitation light conversion sufficiently higher than that of the wavelength converting member of Patent Literature 4. The silica glass 10 of the present embodiment, as described above, overcomes the disadvantage discussed above under "Reason 1" of the silica glass of Patent Literature 4.

The above expression of the silica glass 10 having a light-transmission property sufficient for practical use means that in the light wavelength range from 350 nm to 800 nm, a silica glass 10 having a thickness of 1 mm or larger has a light transmittance of 90% or greater which light transmittance assumes light reflected at a surface of the silica glass to be light not passing through the silica glass.

The silica glass 10 of the present embodiment is fired at a temperature of 400° C. or higher. This firing decomposes or volatilizes all of the organic component in the silica glass 10. The silica glass 10 is, as a result, made of pure $SiO_2$, which is a thermally and chemically stable inorganic substance. The silica glass 10 is therefore highly stable.

As described above, the silica glass 10 of the present embodiment also overcomes the disadvantage discussed above under "Reason 2" of the silica glass of Patent Literature 4.

Formula (1) above defines the density d as having a lower limit value (0.8 g/cm$^3$) and an upper limit value (1.2 g/cm$^3$), which are set on the following grounds:

(Ground for Lower Limit Value of Density d): In a case where the wavelength converting member has a density of less than 0.8 g/cm$^3$, there may be minute holes remaining in the silica glass. In this case, the holes cause (i) light to be scattered and (ii) the silica glass to have decreased transparency, with the result of the wavelength converting member problematically having decreased efficiency of excitation light conversion.

(Ground for Upper Limit Value of Density d): The density of 1.2 g/cm$^3$ is something that the inventors of the present invention have newly discovered as an upper limit value for a density suitable for preparation of a wavelength converting member including silica glass and a plurality of kinds of nitride or oxynitride fluorescent material particles dispersed in the silica glass.

More specifically, the inventors of the present invention have discovered the upper limit value for a density in order to solve the two technical problems below, which may occur in any of the respective wavelength converting members of Non Patent Literature 1, Non Patent Literature 2, and Patent Literature 3.

(Technical Problem with Non Patent Literature 1): According to Non Patent Literature 1, silica glass is fired at a temperature of 1000° C. or higher for an increased density of a wavelength converting member to be produced. A firing temperature of 1000° C. or higher is essential for the silica glass to have a density of larger than 1.2 g/cm$^3$.

A firing temperature of 1000° C., however, problematically causes particles of any fluorescent material other than the α-SiAlON fluorescent material to be degraded thermally (see Comparative Examples 1 and 2 described later).

(Technical Problem with Non Patent Literature 2 and Patent Literature 3): According to Non Patent Literature 2 and Patent Literature 3, a wavelength converting member is produced that contains nitride or oxynitride fluorescent material particles at a high density. Further, silica glass included in the wavelength converting member is fired at a temperature of 500° C. Thus, no thermal degradation is caused to the fluorescent material particles.

The wavelength converting member of each of Non Patent Literature 2 and Patent Literature 3, however, excessively contains fluorescent material particles, and thus causes light to be scattered excessively. It follows that a light-emitting device including the wavelength converting member will problematically have decreased luminous efficiency (see Comparative Example 3 described later).

The wavelength converting member of each of Non Patent Literature 2 and Patent Literature 3 contains 30% or greater by volume of nitride or oxynitride fluorescent material particles at a density of approximately 3.2 to 3.4 g/cm$^3$. This means that the wavelength converting member of each of Non Patent Literature 2 and Patent Literature 3 has a density of at least 1.4 g/cm$^3$.

The inventors of the present invention have newly discovered that the two technical problems above can be solved by producing a wavelength converting member 1 having a density d with an upper limit value of 1.2 g/cm$^3$.

Specifically, in a case where the density d has an upper limit value of 1.2 g/cm$^3$, the silica glass may be fired at a temperature of 800° C. or lower. This solves the technical problem with Non Patent Literature 1. Further, in the above case, the wavelength converting member 1 does not contain fluorescent material particles 11 excessively. This solves the technical problem with Non Patent Literature 2 and Patent Literature 3.

As described above, in the case where the wavelength converting member 1 has a density d with an upper limit value of 1.2 g/cm$^3$, it is possible to solve technical problems that may occur with conventional techniques.

(Material of Fluorescent Material Particles 11)

As will be described later for Examples 1 through 4, the wavelength converting member 1 of the present embodiment may contain a single kind or two or more kinds of fluorescent material particles 11. The wavelength converting member 1 preferably contains two or more kinds of fluorescent material particles 11 for an increased degree of freedom in designing the color of light.

As illustrated in FIG. 2 referred to above, the present embodiment is arranged to disperse the fluorescent material particles 11 in the silica glass 10 at a firing temperature of 400° C. or higher. This firing temperature is higher than a firing temperature for a conventional case in which fluorescent material particles are dispersed in a resin such as silicone.

In view of the higher firing temperature, the fluorescent material particles 11 of the present embodiment are preferably made of a material that is thermally and chemically more stable than a conventional material of fluorescent material particles dispersed in a resin such as silicone.

The fluorescent material particles 11 of the present embodiment are made of a nitride fluorescent material or oxynitride fluorescent material, either of which is excellent in heat resistance. Specific examples of the nitride fluorescent material or oxynitride fluorescent material include the materials below.

(α-SiAlON fluorescent material): Eu-activated α-SiAlON, Ce-activated α-SiAlON

β-SiAlON fluorescent material): Eu-activated β-SiAlON, Ce-activated β-SiAlON (CASN-based fluorescent material): Eu-activated CaAlSiN$_3$, Eu-activated (Sr, Ca) AlSiN$_3$, Ce-activated CALSON, Ce-activated CaAlSiN$_3$ (Other fluorescent material): Conventionally publicly known fluorescent materials such as Ce-activated JEM fluorescent material, Eu-activated (Ca, Ba, Sr)$_2$Si$_5$N$_8$ fluorescent material, Ce-activated La$_3$Si$_6$N$_{11}$ fluorescent material, and Mn-activated γ-AlON fluorescent material Among the fluorescent materials listed above, the α-SiAlON fluorescent material, the β-SiAlON fluorescent material, and the CASN-based fluorescent material are excellent in stability and luminous efficiency in particular, and are each suitably usable as a material for the fluorescent material particles 11.

Further, the Ce-activated α-SiAlON fluorescent material, the Ce-activated β-SiAlON fluorescent material, the Ce-activated JEM fluorescent material, and the Ce-activated La$_3$Si$_6$N$_{11}$ fluorescent material are each excited with high efficiency by blue-violet excitation light having a wavelength of 405 nm or its vicinity.

The Mn-activated γ-AlON fluorescent material is excited with high efficiency by blue excitation light having a wavelength of 450 nm or its vicinity.

The Eu-activated α-SiAlON fluorescent material, the Eu-activated β-SiAlON fluorescent material, the Eu-activated CaAlSiN$_3$ fluorescent material, the Eu-activated (Sr, Ca) AlSiN$_3$ fluorescent material, the Ce-activated CALSON fluorescent material, the Ce-activated CaAlSiN$_3$ fluorescent material, and the Eu-activated (Ca, Ba, Sr)$_2$Si$_5$N$_8$ fluorescent material are each excited with high efficiency by blue-violet to blue excitation light having a wavelength ranging approximately from 405 nm to 450 nm.

In a case where it is a particular object to produce a light-emitting device 100 with improved luminous efficiency, the first fluorescent material particles 11$a$ and the second fluorescent material particles 11$b$ are preferably made respectively of the Eu-activated α-SiAlON fluorescent material and the Eu-activated β-SiAlON fluorescent material for production of a wavelength converting member 1 (see Example 3 described later).

The above materials are preferable because in the above case, it is possible to produce a light-emitting device 100 capable of emitting illumination light with particularly high efficiency in a case where the fluorescent material particles 11 are excited by blue excitation light having a wavelength of 450 nm or its vicinity (see Example 5 described later).

The fluorescent material particles 11 each preferably have a particle size within a range from 1 μm to 30 μm. In a case where the particle size falls within this numerical range, the fluorescent material particles 11 have improved luminous efficiency and excellent ease of handling.

The fluorescent material particles 11 each more preferably have a particle size within a range from 5 μm to 20 μm. In a case where the particle size falls within this numerical range, the fluorescent material particles 11 have particularly improved luminous efficiency. In this case, the wavelength converting member 1 has particularly improved efficiency of excitation light conversion. This makes it possible to produce a light-emitting device having even higher luminous efficiency.

As described above about Non Patent Literature 2 and Patent Literature 3, in the case where a wavelength converting member contains fluorescent material particles in an excessive amount (for example, 30% or larger by volume), those fluorescent material particles will cause light to be scattered excessively, with the result of the wavelength converting member having decreased efficiency of excitation light conversion.

In contrast, as indicated in Formula (2) above, the wavelength converting member 1 of the present embodiment contains the fluorescent material particles 11 at a content rate v defined as $0.1 \leq v \leq 10$. For the wavelength converting member 1 of the present embodiment, the content rate v has a value so adjusted appropriately as above that the wavelength converting member 1 does not contain fluorescent material particles 11 excessively.

The wavelength converting member 1, therefore, has higher efficiency of excitation light conversion than that of the wavelength converting member of Non Patent Literature 2 or Patent Literature 3.

The content rate v indicated in Formula (2) above has a lower limit value (0.1% by volume) and a upper limit value (10% by volume), which are set on the following grounds:

(Ground for Lower Limit Value of Content Rate V): In a case where a wavelength converting member contains fluorescent material particles at a content rate of smaller than 0.1% by volume, those fluorescent material particles will not convert excitation light sufficiently. An illumination device including such a wavelength converting member will problematically be incapable of emitting light having a desired color (for example, white light).

(Ground for Upper Limit Value of Content Rate V): In a case where a wavelength converting member contains fluorescent material particles at a content rate of larger than 10% by volume, those fluorescent material particles will inhibit contraction of the silica glass. In this case, the wavelength converting member may problematically have decreased mechanical strength.

The content rate v preferably has an upper limit value of 3% by volume because that upper limit value further facilitates the preparation of the wavelength converting member 1 through the above sol-gel process. The content rate v, therefore, preferably satisfies the following Formula (3):

$$0.1 \leq v \leq 3 \quad (3)$$

(Configuration of Light-Emitting Device 100)

Figure 3:
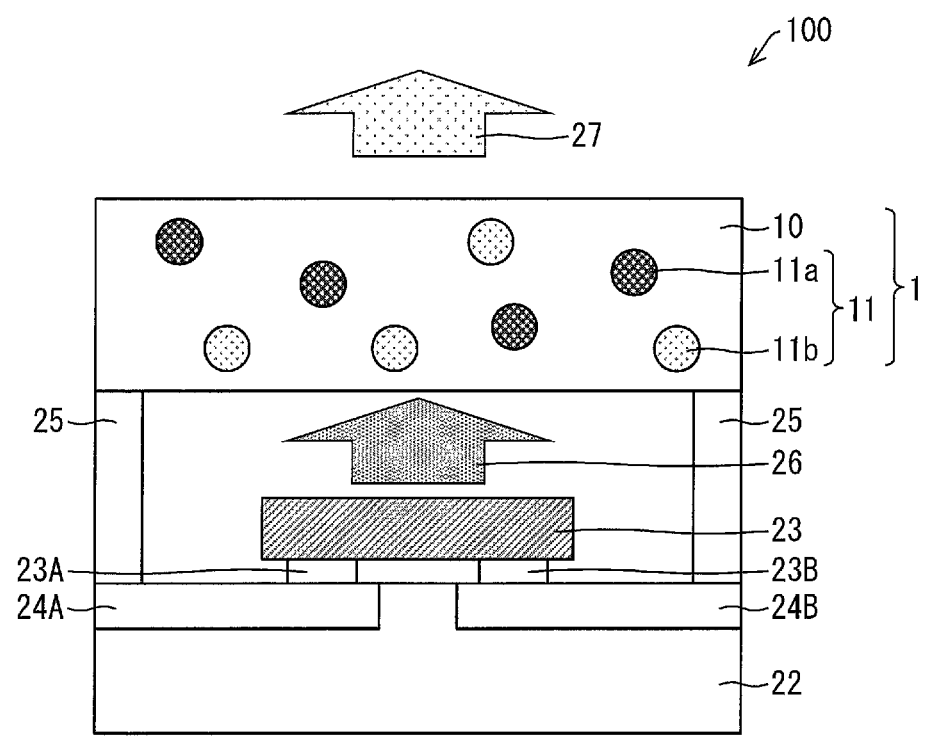
FIG. 3 is a cross-sectional view of a light-emitting device including a wavelength converting member of Embodiment 1 of the present invention, the view illustrating a configuration of the light-emitting device.

FIG. 3 is a cross-sectional view of a light-emitting device 100 including the wavelength converting member 1, the view illustrating a configuration of the light-emitting device 100. The light-emitting device 100 combines the wavelength converting member 1 with a semiconductor light-emitting element 23 (excitation-light source). The description below deals with a configuration of the light-emitting device 100 with reference to FIG. 3.

The semiconductor light-emitting element 23 includes an InGaAlN-based crystal. The semiconductor light-emitting element 23 may be, for example, an LED or laser diode. The semiconductor light-emitting element 23 functions as an excitation-light source for irradiating the wavelength converting member 1 with excitation light 26.

A variation in the composition of a constituent material of the semiconductor light-emitting element 23 such as a light-emitting layer allows the luminescence peak wavelength (that is, a wavelength at which an emission spectrum has a peak) of the excitation light 26, emitted by the semiconductor light-emitting element 23, to vary within the range from 300 nm to 500 nm. The semiconductor light-emitting element 23 may be, for example, an LED that emits excitation light 26 having a luminescence peak wavelength of 445 nm.

The semiconductor light-emitting element 23 is disposed directly above a base 22. The semiconductor light-emitting element 23 is provided with an n-type electrode 23A and a p-type electrode 23B. Further, there are provided an electrode 24A and an electrode 24B on the base 22. The n-type electrode 23A is electrically connected to the electrode 24A, whereas the p-type electrode 23B is electrically connected to the electrode 24B.

The wavelength converting member 1 is fixed with use of an adhesive to support sections 25, which are a portion of the base 22, and is disposed directly above the support sections 25. The wavelength converting member 1 receives excitation light 26 emitted by the semiconductor light-emitting element 23. The excitation light 26 excites the fluorescent material particles 11 included in the wavelength converting member 1, so that the fluorescent material particles 11 emit a fluorescence 27.

In the case where the wavelength converting member 1 contains a plurality of kinds of fluorescent material particles, those kinds of fluorescent material particles emit respective fluorescences, which are mixed to serve as the fluorescence 27. The fluorescence 27 illustrated in FIG. 3 is, as an example, a mixture of (i) a fluorescence emitted by the first fluorescent material particles 11a and having a first peak wavelength and (ii) a fluorescence emitted by the second fluorescent material particles 11b and having a second peak wavelength.

The light-emitting device 100 is arranged such that the fluorescence 27 has a wavelength larger than that of the excitation light 26. In other words, the wavelength converting member 1 functions to convert the excitation light 26 into a fluorescence 27 having a larger wavelength. The light-emitting device 100 emits to the outside a mixture of the excitation light 26 and the fluorescence 27 as illumination light.

In the case where the wavelength converting member 1 contains a plurality of kinds of fluorescent material particles, those kinds of fluorescent material particles are mixed at a mixing ratio, which can be changed so as to appropriately adjust the chromaticity of illumination light emitted by the light-emitting device 100.

In particular, in a case where different fluorescences emitted by respective kinds of fluorescent material particles and having respective colors are mixed to generate white light as illumination light, the light-emitting device 100 is suitable for illumination.

In a case where a light-emitting device 100 is prepared that emits white light as described above, adjusting the mixing ratio of different kinds of fluorescent material particles allows production of (i) a light-emitting device for illumination with light having a cold color close to a color of light of a fluorescent lamp or (ii) a light-emitting device for illumination with light having a warm color close to a color of light of an electric light bulb. The mixing ratio of different kinds of fluorescent material particles needs to be adjusted as appropriate because the different kinds of fluorescent material particles may each have luminous efficiency that varies depending on, for example, the production lot.

As described above, the excitation light 26, emitted by the semiconductor light-emitting element 23, simply needs to have a luminescence peak wavelength that falls within the range from 300 nm to 500 nm. The luminescence peak wavelength of the excitation light 26, however, preferably falls within the range from 350 nm to 480 nm. This is because the semiconductor light-emitting element 23 has higher luminous efficiency within the above wavelength range than within the other wavelength range.

Further, as described later in Embodiment 4, the luminescence peak wavelength of the excitation light 26 particularly preferably falls within the range from 440 nm to 460 nm.

Example of Production of Fluorescent Material Particles 11

The description below deals with Production Examples 1 through 3, each of which is an example of production of the fluorescent material particles 11.

Production Example 1: Production of Eu-Activated β-SiAlON Fluorescent Material Particles Production Example 1 is a production process intended to produce particles of the Eu-activated β-SiAlON fluorescent material, which includes a β-SiAlON fluorescent material having a composition represented by the formula $Si_{6-z}Al_zO_zN_{8-z}$, where z=0.06, and activated by 0.10 at. % of Eu.

First, respective powders of raw materials were weighed to have respective predetermined amounts for the following composition: 93.59% by weight of metal Si powder, 5.02% by weight of aluminium nitride powder, and 1.39% by weight of europium oxide powder. Before the weighing, the respective powders of the raw materials were each passed through a sieve having a mesh size of 45 μm.

The respective powders of the raw materials weighed as above were then mixed with one another over a time period of 10 minutes or longer with use of a mortar and a pestle each made of a silicon nitride sintered body. This mixing produced powder aggregates. Then, these powder aggregates were let fall freely into a boron nitride crucible having a diameter of 20 mm and a height 20 mm.

Next, the crucible was set in a pressurized electric furnace of a graphite resistance heating system, and vacuum was created in the electric furnace as a firing atmosphere with use of a diffusion pump. After that, the temperature was raised from room temperature at a rate of 500° C. per hour to 800° C. Then, nitrogen with a purity of 99.999% by volume was introduced into the electric furnace at a temperature of 800° C., and the pressure was set at 0.5 MPa. Next, the temperature was raised at a rate of 500° C. per hour to 1300° C. Then, the temperature was raised at a rate of 1° C. per minute to 1600° C.

The temperature was kept at 1600° C. for 8 hours. This synthesized a sample. The sample was ground in an agate mortar into powder. This produced a powder sample.

Next, the powder sample produced was subjected to another heat treatment, that is, fired at a temperature of 1600° C. The powder was then ground in a mortar and a pestle each made of silicon nitride. After that, the powder thus ground was let fall freely into a boron nitride crucible having a diameter of 20 mm and a height 20 mm.

Next, the crucible was set in a pressurized electric furnace of a graphite resistance heating system, and vacuum was created in the electric furnace as a firing atmosphere with use of a diffusion pump. After that, the temperature was raised from room temperature at a rate of 500° C. per hour to 800° C. Then, nitrogen with a purity of 99.999% by volume was introduced into the electric furnace at a temperature of 800° C., and the pressure was set at 1 MPa. Next, the temperature was raised at a rate of 500° C. per hour to 1900° C. The temperature was then kept at 1900° C. for 8 hours. This produced a fluorescent material sample.

Next, the fluorescent material sample produced was ground in an agate mortar, and was then treated at a temperature of 60° C. in a mixed acid containing 50% hydrofluoric acid and 70% nitric acid at a ratio of 1:1. The sample treated was washed with pure water, and was then passed through a sieve having a mesh size of 10 μm for removal of any particle with a small particle size. This produced fluorescent material powder.

The fluorescent material powder produced was subjected to X-ray diffraction (XRD; powder X-ray diffraction measurement). This confirmed that the fluorescent material powder had a β-SiAlON crystal structure. Further, the fluorescent material powder was irradiated with light of a lamp having a wavelength of 365 nm. This confirmed that the fluorescent material powder emitted green light.

Production Example 2: Production of Eu-Activated CaAlSiN₃ Fluorescent Material Particles Production Example 2 is a production process intended to produce particles of the Eu-activated $CaAlSiN_3$ fluorescent material, which has a composition represented by the formula $Ca_{0.992}Eu_{0.008}SiAlN_3$.

First, respective powders of raw materials were weighed to have respective predetermined amounts for the following composition: 29.7% by mass of aluminium nitride powder, 33.9% by mass of α-type silicon nitride powder, 35.6% by mass of calcium nitride powder, and 0.8% by mass of europium nitride powder. The europium nitride used was synthesized by nitriding metal europium in ammonia.

The respective powders of the raw materials weighed as above were then mixed with one another over a time period of 10 minutes or longer with use of a mortar and a pestle each made of a silicon nitride sintered body. This mixing produced powder aggregates. Then, these powder aggregates were let fall freely into a boron nitride crucible having a diameter of 20 mm and a height 20 mm.

The powder was weighed, mixed, and molded inside a glove box that was capable of retaining a nitrogen atmosphere containing 1 ppm or less of moisture and 1 ppm or less of oxygen.

Next, the crucible was set in a pressurized electric furnace of a graphite resistance heating system, nitrogen with a purity of 99.999% by volume was introduced into the electric furnace, and the pressure was set at 1 MPa. Then, the temperature was raised from room temperature at a rate of 500° C. per hour to 1800° C. The temperature was then kept at 1800° C. for 2 hours. This produced a fluorescent material sample.

Next, the fluorescent material sample produced was ground in an agate mortar. Then, the fluorescent material sample thus ground was treated at a temperature of 20° C. in a solution prepared by (i) preparing a mixed acid containing, at a ratio of 1:3, 50% hydrofluoric acid and 18 mol/l of sulfuric acid diluted by a factor of 10 and (ii) further diluting the mixed acid with pure water by a factor of 10. The sample treated was washed with pure water, and was then passed through a sieve having a mesh size of 10 μm for removal of any particle with a small particle size. This produced fluorescent material powder.

The fluorescent material powder produced was subjected to XRD involving a Kα ray of Cu. This confirmed that the fluorescent material powder had a $CaAlSiN_3$ crystal structure. Further, the fluorescent material powder was irradiated with light of a lamp having a wavelength of 365 nm. This confirmed that the fluorescent material powder emitted red light.

Production Example 3: Production of Eu-Activated α-SiAlON Fluorescent Material Particles Production Example 3 is a production process intended to produce particles of the Eu-activated α-SiAlON fluorescent material, which has a composition represented by the formula $(Ca_x, Eu_y)(Si_{12-(m+n)}Al_{m+n})(O_nN_{16-n})$, where x=1.8, y=0.075, m=3.75, and n=0.05.

First, respective powders of raw materials were weighed to have respective predetermined amounts for the following composition: 59.8% by mass of α-type silicon nitride powder, 24.3% by mass of aluminium nitride powder, 13.9% by mass of calcium nitride powder, 0.9% by mass of europium oxide powder, and 1.1% by mass of europium nitride powder. The europium nitride used was synthesized by nitriding metal europium in ammonia.

The respective powders of the raw materials weighed as above were then mixed with one another over a time period of 10 minutes or longer with use of a mortar and a pestle each made of a silicon nitride sintered body. This mixing produced powder aggregates. Then, these powder aggregates were passed through a sieve having a mesh size of 250 μm, and were charged into a boron nitride crucible having a diameter of 20 mm and a height 20 mm.

The powder was weighed, mixed, and molded inside a glove box that was capable of retaining a nitrogen atmosphere containing 1 ppm or less of moisture and 1 ppm or less of oxygen.

Next, the crucible was set in a pressurized electric furnace of a graphite resistance heating system, nitrogen with a purity of 99.999% by volume was introduced into the electric furnace, and the pressure was set at 1 MPa. Then, the temperature was raised from room temperature at a rate of 500° C. per hour to 1800° C. The temperature was then kept at 1800° C. for 2 hours for a heat treatment.

Next, the product produced through the heat treatment was ground in an agate mortar, and was then treated at a temperature of 60° C. in a mixed acid containing 50% hydrofluoric acid and 70% nitric acid at a ratio of 1:1. The product treated was washed with pure water, and was then passed through a sieve having a mesh size of 10 μm for removal of any particle with a small particle size. This produced fluorescent material powder.

The fluorescent material powder produced was subjected to XRD involving a Kα ray of Cu. This confirmed that the fluorescent material powder had an α-SiAlON crystal structure. Further, the fluorescent material powder was irradiated with light of a lamp having a wavelength of 365 nm. This confirmed that the fluorescent material powder emitted orange light.

Example of Production of Wavelength Converting Member 1

The description below deals with Examples 1 through 4, each of which is an example of production of the wavelength converting member 1. The description below further deals with Comparative Examples 1 through 3, which are respective comparative examples of Examples 1 through 3. FIG. 10 is a table that shows data of the results of evaluation of respective wavelength converting members produced in the Examples and Comparative Examples.

In each of Examples 1 and 2 and Comparative Examples 1 and 2, a wavelength converting member was produced that included only one kind of fluorescent material particles dispersed in silica glass. In each of Examples 3 and 4 and Comparative Example 3, on the other hand, a wavelength converting member was produced that included two kinds of fluorescent material particles dispersed in silica glass.

Examples 1 and 2 and Comparative Examples 1 and 2

One of the effects produced by the wavelength converting member of the present embodiment is the effect of improving efficiency of excitation light conversion. The description below first deals with Examples 1 and 2 and Comparative Examples 1 and 2 to describe the above effect.

Example 1

In Example 1, a wavelength converting member was produced by dispersing 5% by weight of particles of the Eu-activated β-SiAlON fluorescent material in silica glass prepared through firing at a temperature of 600° C. The production specifically involved the following process:

First, a solution was prepared by mixing 7.21 g of TMOS (available from Junsei Chemical Co., Ltd.), 2.891 g of DMF (available from Wako Pure Chemical Industries, Ltd.), and 2.534 g of methanol (available from Wako Pure Chemical Industries, Ltd.) with one another. The solution prepared was stirred for 10 minutes in a hermetically sealed container made of fluorine resin.

Next, 8.55 ml of reagent pure water (available from Wako Pure Chemical Industries, Ltd.) and 7.37 μl of 10% ammonium hydroxide (available from Wako Pure Chemical Industries, Ltd.) were added to the solution to prepare a sol-gel solution.

The sol-gel solution was stirred for 30 minutes in the hermetically sealed container made of fluorine resin. Then, 0.15 g of the powder of the Eu-activated β-SiAlON fluorescent material, which was prepared in Production Example 1, was mixed in the sol-gel solution. This mixture was stirred for 1 hour in the hermetically sealed container to prepare a fluorescent material-dispersed wet gel.

Next, the fluorescent material-dispersed wet gel prepared was taken out of the container and put in a mold made of fluorine resin and having a diameter (inner diameter) of 17 mm. Then, an aluminum foil was placed on the mold, and the mold was put in a dryer.

Subsequently, the dryer kept its temperature at 35° C. for 8 hours. Then, the temperature was raised to 80° C. over a time period of 24 hours, and the temperature was kept at 80° C. for 120 hours. After that, the temperature was raised again to 150° C. over a time period of 96 hours, and the temperature was kept at 150° C. for 24 hours.

The fluorescent material-dispersed wet gel in the mold was dried as described above to prepare a fluorescent material-dispersed dry gel having a desired shape.

The fluorescent material-dispersed dry gel prepared was then placed in a baking furnace. The temperature was raised from room temperature to 600° C. over a time period of 30 hours. The temperature was kept at 600° C. for 2 hours. In other words, the fluorescent material-dispersed dry gel was fired at a firing temperature of 600° C. to prepare silica glass. The above operation vitrified the fluorescent material-dispersed dry gel into silica glass.

Subsequently, the fired product was shaped with use of, for example, sandpaper. This produced a wavelength converting member including silica glass and fluorescent material particles dispersed substantially uniformly in the silica glass. The wavelength converting member produced had a columnar shape, and had a diameter of 10.8 mm and a thickness of 2 mm.

An observation confirmed that the wavelength converting member produced in Example 1 was vividly green under an indoor fluorescent lamp. Further, the wavelength converting member was irradiated with light of a lamp having a wavelength of 365 nm. This confirmed that the wavelength converting member emitted a green fluorescence having high intensity.

The wavelength converting member of Example 1 was measured for its volume and weight. The density d of the wavelength converting member was calculated on the basis of the measurement results, and was found as d=0.91 g/cm³. Further, the content rate v of the fluorescent material particles was calculated on the assumption that the Eu-activated β-SiAlON fluorescent material particles had a density of 3.21 g/cm³, and was found as v=1.47% by volume.

Comparative Example 1

In Comparative Example 1, a wavelength converting member was produced by dispersing 5% by weight of particles of the Eu-activatedβ-SiAlON fluorescent material in silica glass prepared through firing at a temperature of 1050° C.

In Comparative Example 1, a wavelength converting member was produced as in Example 1 except that (i) the mold in which to put the wet gel had an inner diameter of 25 mm and that (ii) the temperature of firing for silica glass was 1050° C.

A columnar wavelength converting member produced in Comparative Example 1 had a diameter of 10.5 mm and a thickness of 2 mm.

An observation confirmed that the wavelength converting member produced in Comparative Example 1 was white under an indoor fluorescent lamp and darkened at some portions. Further, the wavelength converting member was irradiated with light of a lamp having a wavelength of 365 nm. This confirmed that the wavelength converting member emitted a dim blue-green fluorescence.

In other words, the wavelength converting member of Comparative Example 1 differed from the wavelength converting member of Example 1 in that the former did not emit a green fluorescence having high intensity.

The wavelength converting member of Comparative Example 1 was measured for its volume and weight. The density d of the wavelength converting member was calculated on the basis of the measurement results, and was found as d=2.10 g/cm³. Further, the content rate v of the fluorescent material particles was calculated on the assumption that the Eu-activated β-SiAlON fluorescent material particles had a density of 3.21 g/cm³, and was found as v=3.33% by volume.

Example 2

In Example 2, a wavelength converting member was produced by dispersing 5% by weight of particles of the Eu-activated CaAlSiN₃ fluorescent material in silica glass prepared through firing at a temperature of 400° C.

In Example 2, a wavelength converting member was produced as in Example 1 except that (i) the fluorescent material particles to be dispersed in the silica glass (that is, the fluorescent material to be mixed in the sol-gel solution) were 0.15 g of the powder of the Eu-activated CaAlSiN₃ fluorescent material, which was prepared in Production Example 2, and (ii) the temperature of firing for silica glass was 400° C.

A columnar wavelength converting member produced in Example 2 had a diameter of 10.9 mm and a thickness of 2 mm.

An observation confirmed that the wavelength converting member produced in Example 2 was vividly red under an indoor fluorescent lamp. Further, the wavelength converting member was irradiated with light of a lamp having a wavelength of 365 nm. This confirmed that the wavelength converting member emitted a red fluorescence having high intensity.

The wavelength converting member of Example 2 was measured for its volume and weight. The density d of the wavelength converting member was calculated on the basis of the measurement results, and was found as d=0.89 g/cm³. Further, the content rate v of the fluorescent material particles was calculated on the assumption that the Eu-activated CaAlSiN₃ fluorescent material particles had a density of 3.38 g/cm³, and was found as v=1.36% by volume.

Comparative Example 2

In Comparative Example 2, a wavelength converting member was produced by dispersing 5% by weight of particles of the Eu-activated CaAlSiN₃ fluorescent material in silica glass prepared through firing at a temperature of 1050° C.

In Comparative Example 2, a wavelength converting member was produced as in Comparative Example 1 except that the fluorescent material particles to be dispersed in the silica glass were 0.15 g of the powder of the Eu-activated CaAlSiN₃ fluorescent material, which was prepared in Production Example 2.

A columnar wavelength converting member produced in Comparative Example 2 had a diameter of 10.5 mm and a thickness of 2 mm.

An observation confirmed that the wavelength converting member produced in Comparative Example 2 was white under an indoor fluorescent lamp and darkened at some portions. Further, the wavelength converting member was irradiated with light of a lamp having a wavelength of 365 nm. This confirmed that the wavelength converting member emitted a dim fluorescence having a violet color, which results from a mixture of a red color and a blue color.

In other words, the wavelength converting member of Comparative Example 2 differed from the wavelength converting member of Example 2 in that the former did not emit a red fluorescence having high intensity.

The wavelength converting member of Comparative Example 2 was measured for its volume and weight. The density d of the wavelength converting member was calculated on the basis of the measurement results, and was found as d=2.15 g/cm³. Further, the content rate v of the fluorescent material particles was calculated on the assumption that the Eu-activated CaAlSiN₃ fluorescent material particles had a density of 3.38 g/cm³, and was found as v=3.24% by volume.

(Evaluation of Wavelength Converting Members of Examples 1 and 2 and Comparative Examples 1 and 2)

Subsequently, the respective wavelength converting members of Examples 1 and 2 and Comparative Examples 1 and 2 were evaluated with use of a measurement system that combined a spectral radiance meter (MCPD-7000, available from Otsuka Electronics Ltd.) with an integrating sphere.

Figure 4:
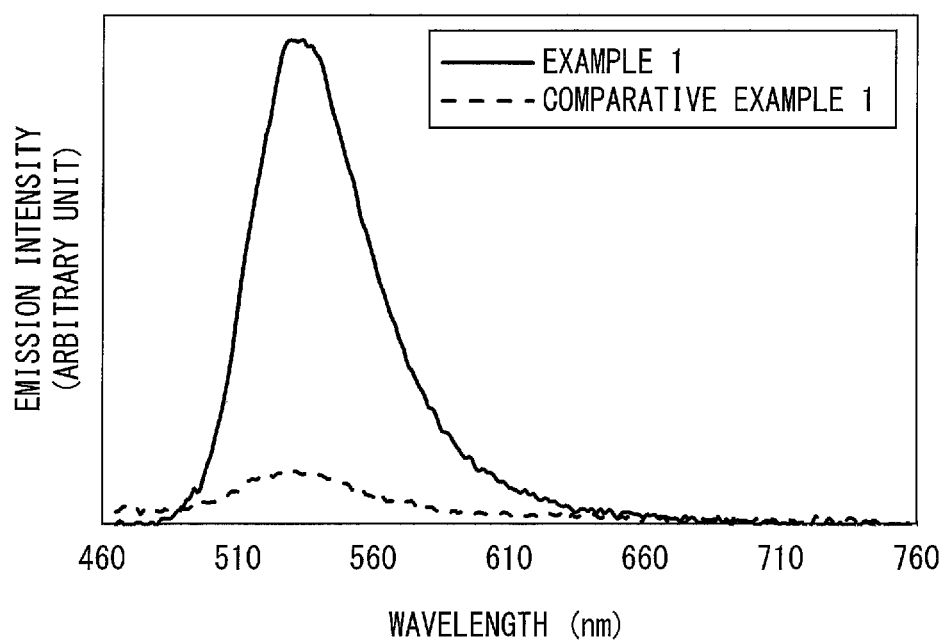
FIG. 4 is a graph illustrating respective emission spectra of respective wavelength converting members of an Example and Comparative Example of the present invention.

FIG. 4 is a graph illustrating respective emission spectra of the respective wavelength converting members of Example 1 and Comparative Example 1 for a case involving, as excitation light, monochromatic light produced by a spectroscopic operation on light of a Xe lamp and having a wavelength of 445 nm.

Figure 5:
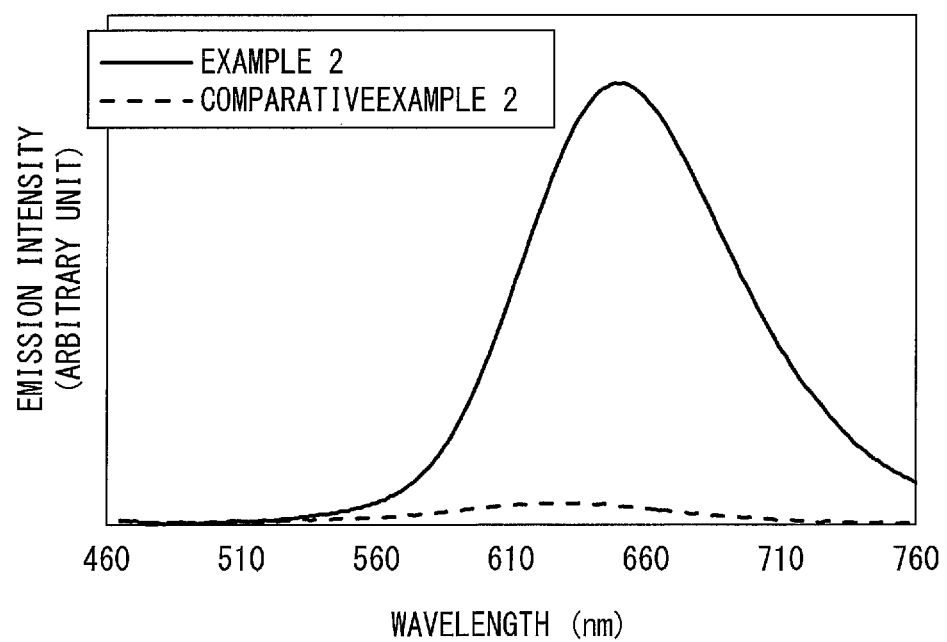
FIG. 5 is a graph illustrating respective emission spectra of respective wavelength converting members of an Example and Comparative Example of the present invention.

FIG. 5 is a graph illustrating respective emission spectra of the respective wavelength converting members of Example 2 and Comparative Example 2 for a case involving, as excitation light, monochromatic light produced by a spectroscopic operation on light of a Xe lamp and having a wavelength of 445 nm.

The respective graphs of FIGS. 4 and 5 each show (i) a horizontal axis indicative of the wavelength (nm) of illumination light and (ii) a vertical axis indicative of the emission intensity (arbitrary unit) of a fluorescence emitted from the wavelength converting member.

FIG. 4 demonstrates that even though the respective wavelength converting members of Example 1 and Comparative Example 1 include the same kind of fluorescent material particles (Eu-activated β-SiAlON fluorescent material particles), the wavelength converting member of Example 1 has emission intensity much higher than that of the wavelength converting member of Comparative Example 1.

FIG. 5 demonstrates that even though the respective wavelength converting members of Example 2 and Comparative Example 2 include the same kind of fluorescent material particles ($CaAlSiN_3$ fluorescent material particles), the wavelength converting member of Example 2 has emission intensity much higher than that of the wavelength converting member of Comparative Example 2.

Stated differently, the respective wavelength converting members of Examples 1 and 2 each have much higher efficiency of excitation light conversion than that of either of the respective wavelength converting members of Comparative Examples 1 and 2. The description below deals with specific examples of relative values of the efficiency of excitation light conversion between the wavelength converting members including the same kind of fluorescent material particles.

In a case where the wavelength converting member of Example 1 is assumed to have an efficiency of excitation light conversion which efficiency is expressed as 100, the wavelength converting member of Comparative Example 1 will have an efficiency of excitation light conversion which efficiency is expressed as 16. In other words, the wavelength converting member of Example 1 has an efficiency of excitation light conversion which efficiency is approximately 6 times that of the wavelength converting member of Comparative Example 1.

In a case where the wavelength converting member of Example 2 is assumed to have an efficiency of excitation light conversion which efficiency is expressed as 100, the wavelength converting member of Comparative Example 2 will have an efficiency of excitation light conversion which efficiency is expressed as 8. In other words, the wavelength converting member of Example 2 has an efficiency of excitation light conversion which efficiency is approximately 12 times that of the wavelength converting member of Comparative Example 2.

The respective wavelength converting members of Comparative Examples 1 and 2 each have emission intensity much lower than that of either of the respective wavelength converting members of Example 2 and Comparative Example 2. One of the reasons for this is the difference in the firing temperature for silica glass.

For instance, the respective wavelength converting members of Comparative Examples 1 and 2 each suffer from much lower emission intensity possibly because (i) an excessively high firing temperature of 1050° C. for silica glass causes some chemical reaction during the firing, (ii) the chemical reaction influences the fluorescent material particles, and (iii) the fluorescent material particles are thermally degraded as a result. This is presumed to decrease the luminous efficiency of the fluorescent material particles from before the firing.

For the respective wavelength converting members of Examples 1 and 2, in contract, the firing temperature for silica glass is 600° C. or 400° C. In each of Examples 1 and 2, the firing temperature for silica glass was significantly lower than that for either of Comparative Examples 1 and 2 as described above.

The fluorescent material particles are thus presumed to be influenced only extremely slightly by chemical reactions during the firing, so that the fluorescent material particles are not thermally degraded. It seems that the fluorescent material particles have luminous efficiency not decreased from before the firing and maintains high luminous efficiency.

Examples 3 and 4 and Comparative Example 3

Another effect produced by the wavelength converting member of the present embodiment is the effect of increasing the degree of freedom in designing the color of light emitted by the wavelength converting member. The description below deals with Examples 3 and 4, each of which describes an arrangement for producing the above effect. The description below further deals with Comparative Example 3, which is a comparative example for Examples 3 and 4.

Example 3

In Example 3, a wavelength converting member was produced by dispersing (i) 3.5% by weight of particles of the Eu-activated β-SiAlON fluorescent material and (ii) 3.5% by weight of particles of the Eu-activated α-SiAlON fluorescent material in silica glass prepared through firing at a temperature of 600° C.

In Example 3, a wavelength converting member was produced as in Example 1 except that (i) the fluorescent material particles to be dispersed in the silica glass were mixed powder of (i) 0.105 g of the powder of the Eu-activated β-SiAlON fluorescent material, which was prepared in Production Example 1, and (ii) 0.105 g of the powder of the Eu-activated α-SiAlON fluorescent material, which was prepared in Production Example 3.

A columnar wavelength converting member produced in Example 3 had a diameter of 10.8 mm and a thickness of 2.3 mm.

The wavelength converting member of Example 3 was measured for its volume and weight. The density d of the wavelength converting member was calculated on the basis of the measurement results, and was found as d=0.92 g/cm³. Further, the content rate v of the fluorescent material particles was calculated on the assumption that the Eu-activated β-SiAlON fluorescent material particles and Eu-activated α-SiAlON fluorescent material particles had a density of 3.21 g/cm³, and was found as v=2.11% by volume.

The wavelength converting member of Example 3 included two kinds of fluorescent material particles, namely (i) particles of the Eu-activated β-SiAlON fluorescent material that emitted a green fluorescence and (ii) particles of the Eu-activated α-SiAlON fluorescent material that emitted an orange fluorescence. The wavelength converting member of Example 3 allowed an increased degree of freedom in designing the color of light emitted by the wavelength converting member as compared to the wavelength converting member of Example 1 or 2.

The wavelength converting member of Example 3 includes fluorescent material particles of a kind similar to that for Comparative Example 3 described below. In a case where the wavelength converting member of Example 1 is assumed to have an efficiency of excitation light conversion which efficiency is expressed as 100, the wavelength converting member of Comparative Example 3 will have an efficiency of excitation light conversion which efficiency is expressed as 81. In other words, the wavelength converting member of Example 3 has an efficiency of excitation light conversion which efficiency is approximately 1.2 times that of the wavelength converting member of Comparative Example 3.

Example 3 is an example method for producing a wavelength converting member including silica glass and a plurality of kinds of fluorescent material particles made of an oxynitride fluorescent material or nitride fluorescent material and dispersed in the silica glass.

The production method includes the step of dispersing in silica glass at least two kinds of fluorescent material particles including (i) first fluorescent material particles that, upon receipt of excitation light, emit a fluorescence having a first peak wavelength (for example, Eu-activated β-SiAlON fluorescent material particles that emit a green fluorescence) and (ii) second fluorescent material particles that, upon receipt of excitation light, emit a fluorescence having a second peak wavelength, which is different from the first peak wavelength (for example, Eu-activated α-SiAlON fluorescent material particles that emit an orange fluorescence).

Further, as described above, the production method is arranged such that the wavelength converting member is so produced as to have a density within a range from 0.8 g/cm$^3$ to 1.2 g/cm$^3$.

Example 4

In Example 4, a wavelength converting member was produced by dispersing (i) 5.6% by weight of particles of the Eu-activated β-SiAlON fluorescent material and (ii) 1.4% by weight of particles of the Eu-activated CaAlSiN$_3$ fluorescent material in silica glass prepared through firing at a temperature of 400° C.

In Example 4, a wavelength converting member was produced as in Example 1 except that (i) the fluorescent material particles to be dispersed in the silica glass were mixed powder of (i) 0.168 g of the powder of the Eu-activated β-SiAlON fluorescent material, which was prepared in Production Example 1, and (ii) 0.042 g of the powder of the Eu-activated CaAlSiN$_3$ fluorescent material, which was prepared in Production Example 2.

A columnar wavelength converting member produced in Example 4 had a diameter of 10.8 mm and a thickness of 1.8 mm.

The wavelength converting member of Example 4 was measured for its volume and weight. The density d of the wavelength converting member was calculated on the basis of the measurement results, and was found as d=0.90 g/cm$^3$. Further, the content rate v of the fluorescent material particles was calculated on the assumption that (i) the Eu-activated β-SiAlON fluorescent material particles had a density of 3.21 g/cm$^3$ and that (ii) the Eu-activated CaAlSiN$_3$ fluorescent material particles had a density of 3.38 g/cm$^3$, and was found as v=2.01% by volume.

The wavelength converting member of Example 4 included two kinds of fluorescent material particles, namely (i) particles of the Eu-activated β-SiAlON fluorescent material that emitted a green fluorescence and (ii) particles of the Eu-activated CaAlSiN$_3$ fluorescent material that emitted a red fluorescence. The wavelength converting member of Example 4, similarly to the wavelength converting member of Example 3, also allowed an increased degree of freedom in designing the color of light emitted by the wavelength converting member as compared to the wavelength converting member of Example 1 or 2.

Comparative Example 3

In Comparative Example 3, a wavelength converting member was produced by dispersing (i) particles of the Eu-activated β-SiAlON fluorescent material and (ii) particles of the Eu-activated α-SiAlON fluorescent material in a thin film of silica glass. The production specifically involved the following process:

First, (i) the powder of the Eu-activated β-SiAlON fluorescent material, which was prepared in Production Example 1, and (ii) the powder of the Eu-activated α-SiAlON fluorescent material, which was prepared in Production Example 3, were mixed with each other at a mixing ratio of 50:50. This prepared a fluorescent material particle mixture. Then, 0.5 g of the fluorescent material particle mixture was weighed.

Next, the above 0.5 g of the fluorescent material particle mixture, 93 μl of TEOS (available from Wako Pure Chemical Industries, Ltd.), and 30 μl of hydrochloric acid (available from Wako Pure Chemical Industries, Ltd.) were added to 100 ml of ethanol (available from Wako Pure Chemical Industries, Ltd.). The resulting ethanol solution was stirred for 24 hours. This prepared a fluorescent material-dispersed solution.

Next, a silica glass substrate made of Pyrex (registered trademark) glass and having a size of 10 mm×10 mm was immersed for 1 minute in the fluorescent material-dispersed solution prepared as above. This caused fluorescent material particles to be deposited on the silica glass substrate. Then, the silica glass substrate was taken out slowly. A fluorescent material-deposited substrate was thus prepared, on which aggregates of the fluorescent material particles were deposited. The fluorescent material-deposited substrate prepared was then fired in the atmosphere at a temperature of 500° C. for 2 hours. This caused the fluorescent material particles to adhere to one another.

Next, a mixed solution containing 4 ml of ethanol, 6 ml of TEOS, 3 ml of pure water, and 1 ml of hydrochloric acid was dropped onto the fluorescent material-deposited substrate in an amount of 4 μl with use of a micropipet. Then, the fluorescent material-deposited substrate was fired again in the atmosphere at a temperature of 500° C. for 2 hours. This formed on the substrate a wavelength converting member including a fluorescent material film.

The substrate did not contain fluorescent material particles dispersed therein, and did not have a wavelength converting function by itself. Thus, in Comparative Example 3, the substrate was not part of a wavelength converting member.

For the wavelength converting member of Comparative Example 3, the content rate v of the fluorescent material particles in the silica glass was measured under a cross-sectional scanning electron microscope (SEM) or through energy dispersive X-ray spectrometry (EDX), and was found as v=65% by volume.

In Comparative Example 3, it was difficult to peel the wavelength converting member from the substrate and directly measure the density of the wavelength converting member separately. The density d of the wavelength converting member was thus calculated from the content rate v of the fluorescent material particles, and was found as d=2.35 g/cm$^3$.

(Effects of Wavelength Converting Member 1)

A wavelength converting member 1 prepared as described above to have a density d (g/cm$^3$) that satisfies Formula (1) above has sufficiently improved efficiency of excitation light conversion.

The wavelength converting member 1, which may contain a plurality of kinds of fluorescent material particles (for example, the first fluorescent material particles 11a and the second fluorescent material particles 11b), allows an increased degree of freedom in designing the color of light emitted by the wavelength converting member 1.

As described above, the wavelength converting member 1 of the present embodiment both (i) allows an increased degree of freedom in designing the color of light emitted by the wavelength converting member 1 and (ii) has sufficiently improved efficiency of excitation light conversion.

The present embodiment, therefore, advantageously makes it possible to both (i) increase the degree of freedom in designing the color of light emitted by the wavelength converting member 1 and (ii) improve the efficiency of excitation light conversion by the wavelength converting member 1 over conventional counterparts.

Embodiment 2

The description below deals with another embodiment of the present invention with reference to FIGS. 3, 6, 7, and 11. For convenience of description, any member of the present embodiment that is identical in function to a corresponding member described for the above embodiment is assigned an identical reference numeral, and is not described here.

The present embodiment is a light-emitting device 100 that is illustrated in FIG. 3 referred to above and that is so prepared as to include a wavelength converting member described for Embodiment 1. The description below also deals with evaluation of performance of the light-emitting device.

The description below first deals with Example 5, which is an example of production of the light-emitting device 100 of the present embodiment. The description below further deals with Comparative Example 4, which is a comparative example for Example 5. FIG. 11 is a table that shows data of the results of evaluation of respective light-emitting devices produced in the Example and Comparative Example.

Example 5

In Example 5, a light-emitting device 100 was prepared that included, as the wavelength converting member 1, the wavelength converting member produced in Example 3 described above.

Specifically, a light-emitting device 100 was prepared by attaching the wavelength converting member of Example 3 to support sections 25. Example 5 used an LED as the semiconductor light-emitting element 23. The semiconductor light-emitting element 23 emitted excitation light 26 having a luminescence peak wavelength of 445 nm.

Figure 6:
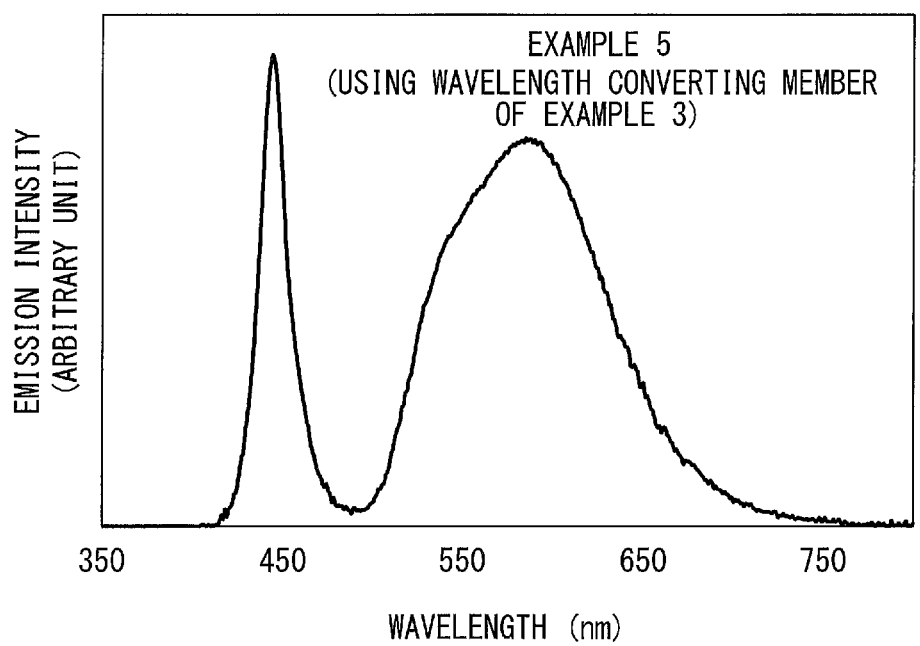
FIG. 6 is a graph illustrating an emission spectrum of a light-emitting device of an Example of the present invention.

FIG. 6 is a graph illustrating an emission spectrum of illumination light emitted by the light-emitting device 100 of Example 5. The illumination light is, as mentioned above, a mixture of the excitation light 26 and the fluorescence 27.

The emission spectrum illustrated in FIG. 6 was measured with use of spectral radiance meter MCPD-7000 (available from Otsuka Electronics Ltd.). The graph of FIG. 6 shows (i) a horizontal axis indicative of the wavelength (nm) of illumination light and (ii) a vertical axis indicative of the emission intensity (arbitrary unit) of illumination light. This definition of the horizontal axis and vertical axis of a graph applies also to FIGS. 7 and 8 referred to later.

The emission spectrum illustrated in FIG. 6 has two peaks: a first peak and a second peak. The first peak appears at a wavelength of 450 nm or its vicinity, and is due to the excitation light 26. The second peak appears at a wavelength of 600 nm or its vicinity, and is due to the fluorescence 27.

The emission spectrum illustrated in FIG. 6 has, (i) over the range of wavelengths of smaller than around 500 nm, a spectral shape corresponding to the shape of the emission spectrum of the excitation light 26 and (ii) over the range of wavelengths of not smaller than around 500 nm, a spectral shape corresponding to the shape of the emission spectrum of the fluorescence 27.

The above correspondence means that the emission spectrum illustrated in FIG. 6 has that portion over the range of wavelengths of not smaller than around 500 nm which corresponds to the emission spectrum of the wavelength converting member of Example 3.

The emission spectrum of illumination light illustrated in FIG. 6 was analyzed. The analysis results show that the illumination light had a color temperature of 3,580 K, a color rendering index of Ra=63, and a chromaticity point of (CIEx, CIEy)=(0.395, 0.371).

Further, the light-emitting device 100 was driven under a drive condition under which the semiconductor light-emitting element 23 emitted excitation light 26 having an energy of 50 mW, and the total luminous flux of the illumination light was measured with use of a measurement system including MCPD-7000 and an integrating sphere. The measurement results confirmed that the total luminous flux of the illumination light was 7.2 lm.

Comparative Example 4

In Comparative Example 4, a light-emitting device 100 was prepared as in Example 5 except that it included, as the wavelength converting member 1, the wavelength converting member produced in Comparative Example 3 described above. Then, as in Example 5, the emission spectrum of illumination light emitted by the light-emitting device 100 was measured.

Figure 7:
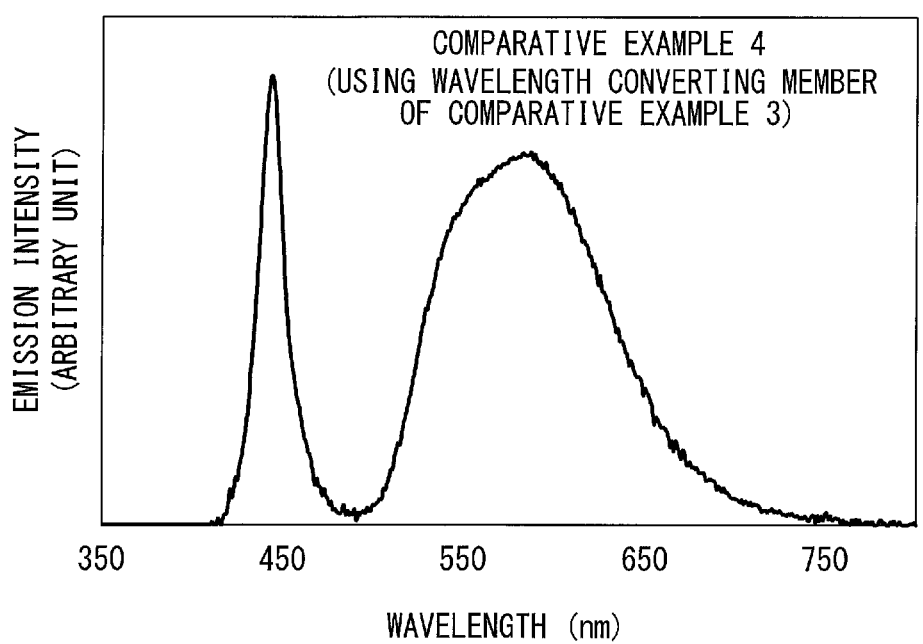
FIG. 7 is a graph illustrating an emission spectrum of a light-emitting device of a Comparative Example of the present invention.

FIG. 7 a graph illustrating an emission spectrum of illumination light emitted by the light-emitting device 100 of Comparative Example 4. As described above, the emission spectrum illustrated in FIG. 7 has that portion over the range of wavelengths of not smaller than around 500 nm which corresponds to the emission spectrum of the wavelength converting member of Comparative Example 3.

The emission spectrum illustrated in FIG. 7 has a shape substantially identical to the shape of the emission spectrum illustrated in FIG. 6. This is because Comparative Example 4 and Example 5 both used the same kinds of fluorescent material particles (namely, Eu-activated β-SiAlON fluorescent material particles and Eu-activated α-SiAlON fluorescent material particles) contained in the wavelength converting member 1.

The emission spectrum of illumination light illustrated in FIG. 7 was analyzed. The analysis results show that the illumination light had a color temperature of 3,546 K, a color rendering index of Ra=60, and a chromaticity point of (CIEx, CIEy)=(0.399, 0.379).

In a case where the light-emitting device 100 was driven under a drive condition under which the excitation light 26 had an energy of 50 mW, the total luminous flux of the illumination light was 5.7 lm.

(Effects of Light-Emitting Device of Present Embodiment)

As described above, the light-emitting device of Example 5 emitted illumination light having particularly high luminous flux as compared to the light-emitting device of Comparative Example 4. The light-emitting device of Example 5 had a color rendering index Ra equivalent to that of the light-emitting device of Comparative Example 4.

In view of the above points, the light-emitting device of Example 5 is particularly suitable for use as an outdoor illumination device or the like. This is because while illumination light for such applications is required to have high luminous efficiency, it is not required to have a great color rendering property.

Although the respective emission spectra illustrated in FIGS. 6 and 7 share a substantially identical shape, the light-emitting device of Example 5 had luminous flux significantly higher than the luminous flux of the light-emitting device of Comparative Example 4. This is for the following reason:

The wavelength converting member included in the light-emitting device of Example 5 (that is, the wavelength converting member of Example 3), as described above, included fluorescent material particles dispersed in silica glass substantially uniformly at an appropriately adjusted volume density. This configuration prevents light from being scattered excessively, and thus improves the efficiency of excitation light conversion by the wavelength converting member, with the result of the light-emitting device having improved luminous efficiency.

The wavelength converting member included in the light-emitting device of Comparative Example 4 (that is, the wavelength converting member of Comparative Example 3), on the other hand, included a fluorescent material film in close contact with the substrate. This configuration is known to be preferable for a case where the semiconductor light-emitting element 23 is an excitation-light source that emits high-power excitation light 26 (for example, a laser diode that emits high-power laser light).

This is because in a case where a wavelength converting member is irradiated with excitation light 26 having extremely high intensity per unit area, wavelength conversion by the fluorescent material film generates a large amount of heat. In other words, the above configuration allows heat generated by the fluorescent material film to be discharged to the substrate efficiently.

The wavelength converting member included in the light-emitting device of Comparative Example 4, however, contained fluorescent material particles excessively. Such fluorescent material particles cause light to be scattered excessively, and thus decrease the efficiency of excitation light conversion by the wavelength converting member, with the result of the light-emitting device having decreased luminous efficiency.

Therefore, unless the wavelength converting member is irradiated with excitation light 26 having an extremely high light density per unit area, the light-emitting device of Example 5 is more suitable than the light-emitting device of Comparative Example 4 because the former has luminous efficiency higher than that of the latter.

More specifically, in a case where the wavelength converting member is irradiated with excitation light having a light intensity (light density) of 0.5 $W/mm^2$ or less per unit area, the light-emitting device of Example 5 is suitable. The light intensity of 0.5 $W/mm^2$ or less is achieved in a case where the semiconductor light-emitting element 23 is, for example, an LED.

The light-emitting device of Example 5 preferably has an excitation light intensity of 0.5 $W/mm^2$ or less for the following reason:

In a case where the wavelength converting member of Example 3 (or Example 4) described above is irradiated with excitation light having an intensity of larger than 0.5 $W/mm^2$, wavelength conversion by the fluorescent material particles generates heat due to an energy loss in an excessive amount. The wavelength converting member will have a temperature of higher than 200° C. as a result.

In the case where the wavelength converting member has a temperature of higher than 200° C., the wavelength converting member problematically has much lower conversion efficiency due to thermal quenching of the fluorescent material particles (which is not thermal degradation, but is reversible).

Embodiment 3

The description below deals with another embodiment of the present invention with reference to FIGS. 8 and 11. For convenience of description, any member of the present embodiment that is identical in function to a corresponding member described for the above embodiment is assigned an identical reference numeral, and is not described here.

The present embodiment is, as in Embodiment 2, a light-emitting device 100 that is illustrated in FIG. 3 referred to above and that is so prepared as to include a wavelength converting member described for Embodiment 1. The description below also deals with evaluation of performance of the light-emitting device. The description below first deals with Example 6, which is an example of production of the light-emitting device 100 of the present embodiment.

Example 6

In Example 6, a light-emitting device 100 was prepared as in Example 5 except that it included, as the wavelength converting member 1, the wavelength converting member produced in Example 4 described above. Then, as in Example 5, the emission spectrum of illumination light emitted by the light-emitting device 100 was measured.

Figure 8:
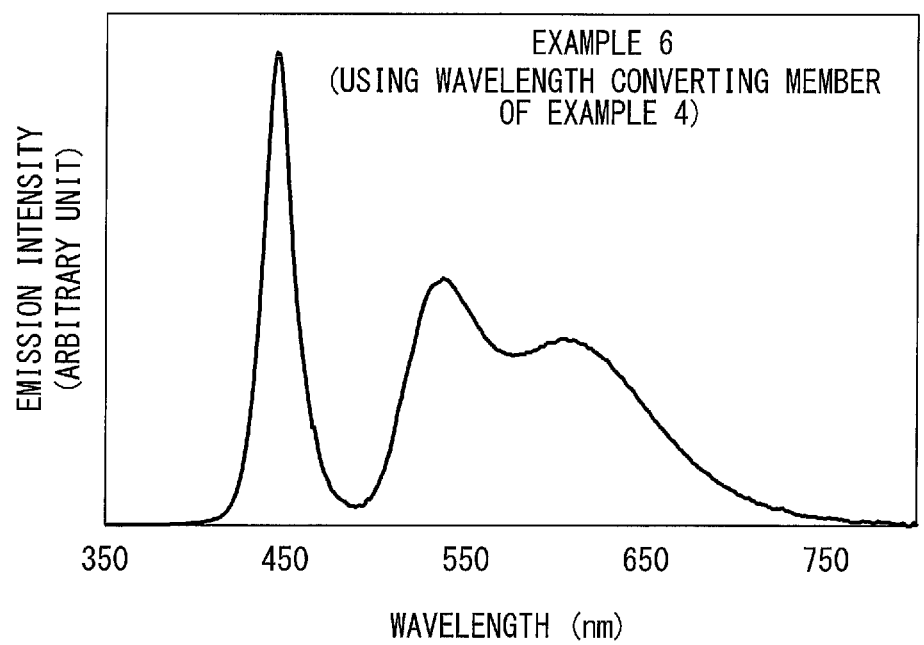
FIG. 8 is a graph illustrating an emission spectrum of a light-emitting device of an Example of the present invention.

FIG. 8 a graph illustrating an emission spectrum of illumination light emitted by the light-emitting device 100 of Example 6. As described above, the emission spectrum illustrated in FIG. 8 has that portion over the range of wavelengths of not smaller than around 500 nm which corresponds to the emission spectrum of the wavelength converting member of Example 4.

The emission spectrum illustrated in FIG. 8 has three peaks: a first peak, a second peak, and a third peak. The first peak is, as described above, due to the excitation light 26. The first peak appears at a wavelength of 450 nm or its vicinity. The second and third peaks are due to the fluorescence 27. The second peak appears at a wavelength of 540 nm or its vicinity. The third peak appears at a wavelength of 600 nm or its vicinity.

The emission spectrum of illumination light illustrated in FIG. 8 was analyzed. The analysis results show that the illumination light had a color temperature of 5,000 K, a color rendering index of Ra=78, and a chromaticity point of (CIEx, CIEy)=(0.334, 0.330).

In a case where the light-emitting device 100 was driven under a drive condition under which the excitation light 26 had an energy of 50 mW, the total luminous flux of the illumination light was 5.9 lm.

(Effects of Light-Emitting Device of Present Embodiment)

As described above, the light-emitting device of Example 6 emitted illumination light having a particularly high color rendering index Ra as compared to the light-emitting device of Comparative Example 4. The light-emitting device of Example 6 had luminous flux equivalent in value to that of the light-emitting device of Comparative Example 4.

In view of the above points, the light-emitting device of Example 6 is particularly suitable for use as, for example, a store illumination device or a backlight device for a liquid crystal panel of an image display device. This is because while illumination light for such applications is required to have a great color rendering property, it is not required to have high luminous efficiency.

Embodiment 4

The description below deals with another embodiment of the present invention with reference to FIG. 9. For convenience of description, any member of the present embodiment that is identical in function to a corresponding member described for the above embodiment is assigned an identical reference numeral, and is not described here.

The description above of Embodiment 1 notes that the luminescence peak wavelength of the excitation light 26 preferably falls within the range from 350 nm to 480 nm because the semiconductor light-emitting element 23 has higher luminous efficiency within the above wavelength range than within the other wavelength range.

Further, as mentioned for Embodiment 1 described above, the luminescence peak wavelength of the excitation light 26 particularly preferably falls within the range from 440 nm to 460 nm. The description below deals with the reason for the particular preferability with reference to FIG. 9.

Figure 9:
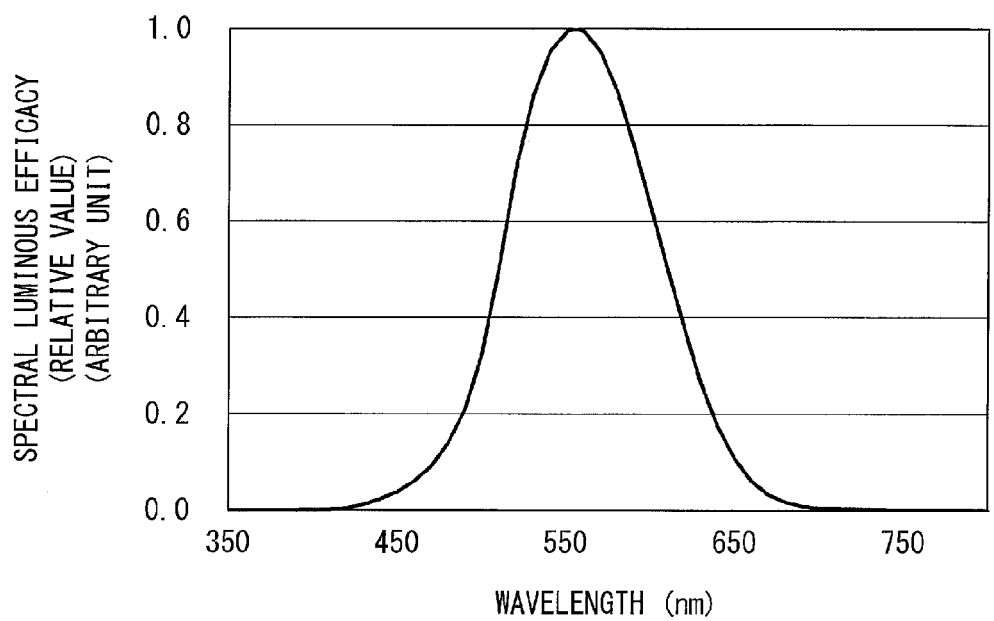
FIG. 9 is a graph illustrating a visibility curve for a human being.

FIG. 9 is a graph illustrating a visibility curve for a human being. The graph of FIG. 9 shows (i) a horizontal axis indicative of the wavelength (nm) of light and (ii) a vertical axis indicative of the relative value (arbitrary unit) of spectral luminous efficacy of light for a human being. FIG. 9 shows that the wavelength values ranging from 440 nm to 460 nm are close to the lower limit value of the wavelength range of light visible to the human eye.

As illustrated in FIGS. 6 through 8 referred to above, in the case where the excitation light 26 has a luminescence peak wavelength that falls within the range from 440 nm to 460 nm, the light-emitting device 100 emits illumination light having an emission spectrum that has a peak (first peak) due to the excitation light 26 within the above wavelength range. This is because the excitation light 26, which has a wavelength shorter than that of the fluorescence 27, has a dominant influence within the above wavelength range.

In the case where the excitation light 26 has a luminescence peak wavelength that falls within the range from 440 nm to 460 nm as described above, the excitation light 26 is suitably usable as part of illumination light visible to the human eye.

Stated differently, in the above case, it is possible to suitably match (i) the emission spectrum of illumination light emitted by the light-emitting device 100 with (ii) the visibility curve for a human being. This makes it possible to produce a light-emitting device 100 having particularly improved luminous efficiency.

[Variations]

The description above of Embodiment 1 (in particular, Examples 3 and 4) deals with, for example, a configuration in which the wavelength converting member includes two kinds of fluorescent material particles which two kinds emit respective fluorescences having different colors.

However, for a further increased degree of freedom in designing the color of light emitted by the wavelength converting member, the wavelength converting member may include three or more kinds of fluorescent material particles which three or more kinds emit respective fluorescences having different colors.

The wavelength converting member may, as an example, include three kinds of fluorescent material particles, namely (i) first fluorescent material particles that emit a fluorescence having a first peak wavelength (for example, a green fluorescence), (ii) second fluorescent material particles that emit a fluorescence having a second peak wavelength (for example, an orange to red fluorescence), and (iii) third fluorescent material particles that emit a fluorescence having a third peak wavelength (for example, a blue fluorescence).

The first peak wavelength ranges from 500 nm to 550 nm. The first fluorescent material particles are made suitably of a Eu-activated β-SiAlON fluorescent material, a Ce-activated α-SiAlON fluorescent material, or a Mn-activated γ-AlON fluorescent material.

The second peak wavelength ranges from 580 nm to 680 nm. The second fluorescent material particles are made suitably of a Eu-activated α-SiAlON fluorescent material, a Eu-activated $CaAlSiN_3$ fluorescent material, a Eu-activated (Sr, Ca) $AlSiN_3$ fluorescent material, a Ce-activated CALSON fluorescent material, or a Eu-activated (Ca, Ba, $Sr)_2Si_5N_8$.

The third peak wavelength ranges from 420 nm to 480 nm. The third fluorescent material particles are made suitably of a Ce-activated JEM fluorescent material, a Ce-activated β-SiAlON fluorescent material, or a Ce-activated $La_3Si_6N_{11}$ fluorescent material.

The first peak wavelength, the second peak wavelength, and the third peak wavelength are different from one another. Alternatively, the second peak wavelength and the third peak wavelength may be referred to collectively as the second peak wavelength. In this case, the second fluorescent material particles and the third fluorescent material particles may be referred to collectively as the second fluorescent material particles.

A plurality of different kinds of fluorescent material particles may be regarded as a single kind of fluorescent material particles as long as those kinds of fluorescent material particles emit respective fluorescences having respective peak wavelengths that are substantially identical to each other (that is, respective fluorescences having respective colors substantially identical to each other). For example, two kinds of fluorescent material particles which two kinds emit respective green fluorescences having respective first peak wavelengths substantially identical to each other may be included in the wavelength converting member as the first fluorescent material particles.

[Recap]

A wavelength converting member (1) according to a first aspect of the present invention includes: silica glass (10); and a plurality of fluorescent material particles (11) including an oxynitride fluorescent material or nitride fluorescent material and dispersed in the silica glass, the plurality of fluorescent material particles including at least two kinds of fluorescent material particles, the at least two kinds of fluorescent material particles including: a first fluorescent material particle (11a) that, upon receipt of excitation light (26), emits a fluorescence (27) having a first peak wavelength; and a second fluorescent material particle (11b) that, upon receipt of the excitation light, emits a fluorescence having a second peak wavelength, which is different from the first peak wavelength, the wavelength converting member having a density (d) within a range from 0.8 g/cm³ to 1.2 g/cm³.

With the above configuration, the wavelength converting member has a density d (g/cm³) that falls within the numerical range indicated in Formula (1) above, and thus has high efficiency of excitation light conversion.

Further, the wavelength converting member includes at least two kinds of fluorescent material particles which at least two kinds include (i) first fluorescent material particles (for example, fluorescent material particles that emit a green fluorescence) and (ii) second fluorescent material particles (for example, fluorescent material particles that emit a red fluorescence). The above configuration thus increases the degree of freedom in designing the color of light emitted by the wavelength converting member.

As described above, a wavelength converting member according to an aspect of the present invention both (i) increases the degree of freedom in designing the color of light emitted by a wavelength converting member and (ii) sufficiently improves the efficiency of excitation light conversion by the wavelength converting member.

The above configuration, therefore, advantageously allows production of a wavelength converting member having (i) an increased degree of freedom in designing the color of light emitted and (ii) efficiency of excitation light conversion which efficiency is improved over conventional art.

In a second aspect of the present invention, a wavelength converting member is preferably arranged such that, in the first aspect of the present invention, the plurality of fluorescent material particles are included in the wavelength converting member at a content rate (v) within a range from 0.1% by volume to 10% by volume.

With the above configuration, the wavelength converting member includes the fluorescent material particles at a content rate v within the numerical range indicated in Formula (2) above, and thus advantageously has high efficiency of excitation light conversion.

In a third aspect of the present invention, a wavelength converting member is preferably arranged such that, in the second aspect of the present invention, the plurality of fluorescent material particles are included in the wavelength converting member at a content rate within a range from 0.1% by volume to 3% by volume.

With the above configuration, the wavelength converting member includes the fluorescent material particles at a content rate v within the numerical range indicated in Formula (3) above. The above configuration thus advantageously further facilitates preparing a wavelength converting member through a sol-gel process.

In a fourth aspect of the present invention, a wavelength converting member is preferably arranged such that, in any one of the first to third aspects of the present invention, in a light wavelength range from 350 nm to 800 nm, the silica glass, in a case where the silica glass has a thickness of 1 mm or larger, has a light transmittance of 90% or greater which light transmittance assumes light reflected at a surface of the silica glass to be light not passing through the silica glass.

With the above configuration, the silica glass has a sufficient light-transmission property. The above configuration thus advantageously further improves the efficiency of excitation light conversion by the wavelength converting member.

In a fifth aspect of the present invention, a wavelength converting member is preferably arranged such that, in any one of the first to fourth aspects of the present invention, the plurality of fluorescent material particles includes at least one of a β-SiAlON fluorescent material, a α-SiAlON fluorescent material, or a CASN-based fluorescent material.

The above configuration allows a wavelength converting member to be so prepared as to include fluorescent material particles that are particularly excellent in stability and luminous efficiency. The above configuration thus advantageously further improves the reliability of the wavelength converting member and the efficiency of excitation light conversion by the wavelength converting member.

In a sixth aspect of the present invention, a wavelength converting member is preferably arranged such that, in any one of the first to fifth aspects of the present invention, the plurality of fluorescent material particles each have a particle size within a range from 1 μm to 30 μm.

With the above configuration, the fluorescent material particles have high luminous efficiency, with the result of the wavelength converting member having further improved efficiency of excitation light conversion. Further, the fluorescent material particles have great ease of handling, which advantageously further facilitates preparation of a wavelength converting member.

In a seventh aspect of the present invention, a wavelength converting member is preferably arranged such that, in the sixth aspect of the present invention, the plurality of fluorescent material particles each have a particle size within a range from 5 μm to 20 μm.

With the above configuration, the fluorescent material particles have particularly high luminous efficiency, with the result of the wavelength converting member advantageously having even further improved efficiency of excitation light conversion.

A light-emitting device (100) according to an eighth aspect of the present invention preferably includes: the wavelength converting member according to any one of the first to seventh aspects of the present invention; and an excitation-light source (semiconductor light-emitting element 23) configured to irradiate the wavelength converting member with the excitation light.

The above configuration allows a light-emitting device to be produced that includes a wavelength converting member having (i) a high degree of freedom in designing the color of light emitted and (ii) efficiency of excitation light conversion which efficiency is improved over conventional art. The above configuration thus advantageously allows production of a light-emitting device that is excellent in color rendering property and luminous efficiency.

In a case where the light-emitting device is used as an outdoor illumination device or the like, the light-emitting device is preferably particularly excellent in luminous efficiency (see Example 5 above). In a case where the light-emitting device is included in an image display device or the like, the light-emitting device is preferably particularly excellent in color rendering property (see Example 6 above).

In a ninth aspect of the present invention, a light-emitting device is preferably arranged such that, in the eighth aspect of the present invention, the excitation light has a peak wavelength within a range from 350 nm to 480 nm.

With the above configuration, the excitation-light source has high luminous efficiency, with the result of the light-emitting device advantageously having further improved luminous efficiency.

In a tenth aspect of the present invention, a light-emitting device is preferably arranged such that, in the ninth aspect of the present invention, the excitation light has a peak wavelength within a range from 440 nm to 460 nm.

The above configuration allows the light-emitting device to emit illumination light having an emission spectrum that matches suitably with the visibility curve for a human being, with the result of the light-emitting device advantageously having even further improved luminous efficiency.

In an eleventh aspect of the present invention, a light-emitting device is preferably arranged such that, in any one of the eighth to tenth aspects of the present invention, the excitation light, with which the wavelength converting member is irradiated, has a light intensity of 0.5 W/mm$^2$ or less per unit area.

The above configuration prevents thermal quenching of the fluorescent material particles from occurring due to excessive heat generation by the fluorescent material particles. The above configuration thus advantageously prevents a decrease in the efficiency of excitation light conversion by the wavelength converting member, and prevents a decrease in the luminous efficiency of the light-emitting device.

A method according to a twelfth aspect of the present invention for producing a wavelength converting member is a method for producing a wavelength converting member including silica glass and a plurality of fluorescent material particles including an oxynitride fluorescent material or nitride fluorescent material and dispersed in the silica glass, the method including the step of dispersing in the silica glass at least two kinds of fluorescent material particles, the at least two kinds of fluorescent material particles including: a first fluorescent material particle that, upon receipt of excitation light, emits a fluorescence having a first peak wavelength; and a second fluorescent material particle that, upon receipt of the excitation light, emits a fluorescence having a second peak wavelength, which is different from the first peak wavelength, the wavelength converting member being so produced as to have a density within a range from 0.8 g/cm$^3$ to 1.2 g/cm$^3$.

The above configuration advantageously allows production of a wavelength converting member having (i) an increased degree of freedom in designing the color of light emitted and (ii) efficiency of excitation light conversion which efficiency is improved over conventional art.

[Supplemental Notes]

The present invention is not limited to the description of the embodiments above, but may be altered in various ways by a skilled person within the scope of the claims. Any embodiment based on a proper combination of technical means disclosed in different embodiments is also encompassed in the technical scope of the present invention. Further, combining technical means disclosed in different embodiments can provide a new technical feature.

The present invention may also be described as below.

A wavelength converting member according to an aspect of the present invention is a wavelength converting member including: silica glass; and a nitride fluorescent material or oxynitride fluorescent material dispersed uniformly in the silica glass, the wavelength converting member having a density within a range from 0.8 g/cm$^3$ to 1.2 g/cm$^3$.

The above configuration allows production of a wavelength converting member having (i) a high degree of freedom in color design and (ii) high efficiency of light extraction.

The wavelength converting member according to an aspect of the present invention may be arranged such that the fluorescent material is dispersed uniformly in the wavelength converting member in an amount within a range from 0.1% by volume to 10% by volume.

The above configuration prevents the fluorescent material from scattering light excessively, and thus allows production of a wavelength converting member having high light-extraction efficiency.

The wavelength converting member according to an aspect of the present invention may be arranged such that in a wavelength region from 350 nm to 800 nm, the silica glass, in a case where the silica glass has a thickness of 1 mm or larger, has a light transmittance of 90% or greater which light transmittance assumes light reflected at a surface of the silica glass to be light not passing through the silica glass.

With the above configuration, the silica glass has high transparency. The above configuration thus allows production of a wavelength converting member having higher light-extraction efficiency.

The wavelength converting member according to an aspect of the present invention may be arranged such that the nitride fluorescent material or oxynitride fluorescent material includes at least one of a β-sialon fluorescent material, a α-sialon fluorescent material, or a CASN-based fluorescent material.

The above configuration allows production of a wavelength converting member that has high luminous efficiency and that is stable thermally and chemically.

A light-emitting device according to an aspect of the present invention includes: the wavelength converting member; and a semiconductor light-emitting element configured to irradiate the wavelength converting member with excitation light.

The above configuration allows production of a light-emitting device that has high luminous efficiency, that is stable thermally and chemically, and that is excellent in reliability.

The light-emitting device according to an aspect of the present invention may be arranged such that the excitation light has an emission spectrum having a peak wavelength within a range from 440 nm to 460 nm.

With the above configuration, the light-emitting device has an emission spectrum that matches well with a visibility curve. The above configuration thus allows production of a light-emitting device having high luminous efficiency.

The light-emitting device according to an aspect of the present invention may be arranged such that the excitation light, with which the wavelength converting member is irradiated, has a light density of 0.5 W/mm$^2$ or less per unit area.

The above arrangement reduces heat generation by the wavelength converting member, and thus allows production of a light-emitting device having high luminous efficiency.

INDUSTRIAL APPLICABILITY

The present invention is applicable to (i) a wavelength converting member including a fluorescent material that converts excitation light into fluorescence and (ii) a light-emitting device including the wavelength converting member.

REFERENCE SIGNS LIST 1 wavelength converting member
10 silica glass
11 fluorescent material particle
11a first fluorescent material particle
11b second fluorescent material particle
23 semiconductor light-emitting element (excitation-light source)

26 excitation light
27 fluorescence
100 light-emitting device
d density of wavelength converting member
v content rate of fluorescent material particles in a wavelength converting member

The invention claimed is:

1. A wavelength converting member comprising:
   silica glass; and
   a plurality of fluorescent material particles including an oxynitride fluorescent material or nitride fluorescent material and dispersed in the silica glass,
   the plurality of fluorescent material particles including at least two kinds of fluorescent material particles,
   the at least two kinds of fluorescent material particles including:
      a first fluorescent material particle that, upon receipt of excitation light, emits a fluorescence having a first peak wavelength; and
      a second fluorescent material particle that, upon receipt of the excitation light, emits a fluorescence having a second peak wavelength, which is different from the first peak wavelength,
   the wavelength converting member having a density within a range from 0.8 g/cm$^3$ to 1.2 g/cm$^3$.

2. The wavelength converting member according to claim 1, wherein the plurality of fluorescent material particles are included in the wavelength converting member at a content rate within a range from 0.1% by volume to 10% by volume.

3. The wavelength converting member according to claim 2, wherein the plurality of fluorescent material particles are included in the wavelength converting member at a content rate within a range from 0.1% by volume to 3% by volume.

4. The wavelength converting member according to claim 1, wherein in a light wavelength range from 350 nm to 800 nm, the silica glass, in a case where the silica glass has a thickness of 1 mm or larger, has a light transmittance of 90% or greater which light transmittance assumes light reflected at a surface of the silica glass to be light not passing through the silica glass.

5. The wavelength converting member according to claim 1, wherein the plurality of fluorescent material particles includes at least one of a β-SiAlON fluorescent material, an α-SiAlON fluorescent material, or a CASN-based fluorescent material.

6. The wavelength converting member according to claim 1, wherein the plurality of fluorescent material particles each have a particle size within a range from 1 μm to 30 μm.

7. The wavelength converting member according to claim 6, wherein the plurality of fluorescent material particles each have a particle size within a range from 5 μm to 20 μm.

8. A light-emitting device comprising:
   a wavelength converting member according to claim 1; and
   an excitation-light source configured to irradiate the wavelength converting member with the excitation light.

9. The light-emitting device according to claim 8, wherein the excitation light has a peak wavelength within a range from 350 nm to 480 nm.

10. The light-emitting device according to claim 9, wherein the excitation light has a peak wavelength within a range from 440 nm to 460 nm.

11. The light-emitting device according to claim 8, wherein the excitation light, with which the wavelength converting member is irradiated, has a light intensity of 0.5 W/mm$^2$ or less per unit area.

12. A method for producing a wavelength converting member including silica glass and a plurality of fluorescent material particles including an oxynitride fluorescent material or nitride fluorescent material and dispersed in the silica glass,
   the method comprising the step of
   dispersing in the silica glass at least two kinds of fluorescent material particles,
   the at least two kinds of fluorescent material particles including:
      a first fluorescent material particle that, upon receipt of excitation light, emits a fluorescence having a first peak wavelength; and
      a second fluorescent material particle that, upon receipt of the excitation light, emits a fluorescence having a second peak wavelength, which is different from the first peak wavelength,
   the wavelength converting member being so produced as to have a density within a range from 0.8 g/cm$^3$ to 1.2 g/cm$^3$.

* * * * *